United States Patent
Chiu et al.

(10) Patent No.: US 10,186,542 B1
(45) Date of Patent: Jan. 22, 2019

(54) PATTERNING FOR SUBSTRATE FABRICATION

(71) Applicant: Taiwan Semiconductor Manufacturing Co., Ltd., Hsinchu (TW)

(72) Inventors: Wei-Chao Chiu, Hsinchu (TW); Kai Tzeng, Pingtung County (TW); Chih-Chien Wang, Changhua County (TW); Chun-Wei Chang, Tainan (TW); Ching-Sen Kuo, Taipei (TW); Feng-Jia Shiu, Hsinchu County (TW); Cheng-Ta Wu, Chiayi County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 2 days.

(21) Appl. No.: 15/652,508

(22) Filed: Jul. 18, 2017

(51) Int. Cl.
| | |
|---|---|
| H01L 27/00 | (2006.01) |
| H01L 27/146 | (2006.01) |
| H01L 21/761 | (2006.01) |
| H01L 21/027 | (2006.01) |
| H01L 21/265 | (2006.01) |
| G03F 7/09 | (2006.01) |
| G03F 7/095 | (2006.01) |
| G03F 7/11 | (2006.01) |
| G03F 7/16 | (2006.01) |
| G03F 7/20 | (2006.01) |
| G03F 7/38 | (2006.01) |
| G03F 7/32 | (2006.01) |

(52) U.S. Cl.
CPC .......... *H01L 27/1463* (2013.01); *G03F 7/094* (2013.01); *G03F 7/095* (2013.01); *G03F 7/11* (2013.01); *H01L 21/0274* (2013.01); *H01L 21/26513* (2013.01); *H01L 21/761* (2013.01); *H01L 27/14683* (2013.01); *G03F 7/162* (2013.01); *G03F 7/168* (2013.01); *G03F 7/2004* (2013.01); *G03F 7/32* (2013.01); *G03F 7/38* (2013.01)

(58) Field of Classification Search
CPC .................................................. H01L 27/1463
See application file for complete search history.

(56) References Cited

U.S. PATENT DOCUMENTS

| | | | |
|---|---|---|---|
| 5,668,044 A * | 9/1997 | Ohno | ................ H01L 21/76224 148/DIG. 50 |
| 8,798,666 B2 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |

(Continued)

*Primary Examiner* — William Harriston
(74) *Attorney, Agent, or Firm* — Haynes and Boone, LLP

(57) ABSTRACT

Various examples of a technique for forming a pattern for substrate fabrication are disclosed herein. In an example, a method includes receiving a substrate. A patterned resist is formed on the substrate and has a trench defined therein. A dielectric is deposited on the patterned resist and within the trench such that the dielectric narrows a width of the trench to further define the trench. A fabrication process is performed on a region of the substrate underlying the trench defined by the dielectric.

20 Claims, 24 Drawing Sheets

(56) References Cited

U.S. PATENT DOCUMENTS

| | | |
|---|---|---|
| 9,256,133 B2 | 2/2016 | Chang |
| 9,536,759 B2 | 1/2017 | Yang et al. |
| 9,548,303 B2 | 1/2017 | Lee et al. |
| 2017/0186808 A1 | 6/2017 | Chiu et al. |

\* cited by examiner

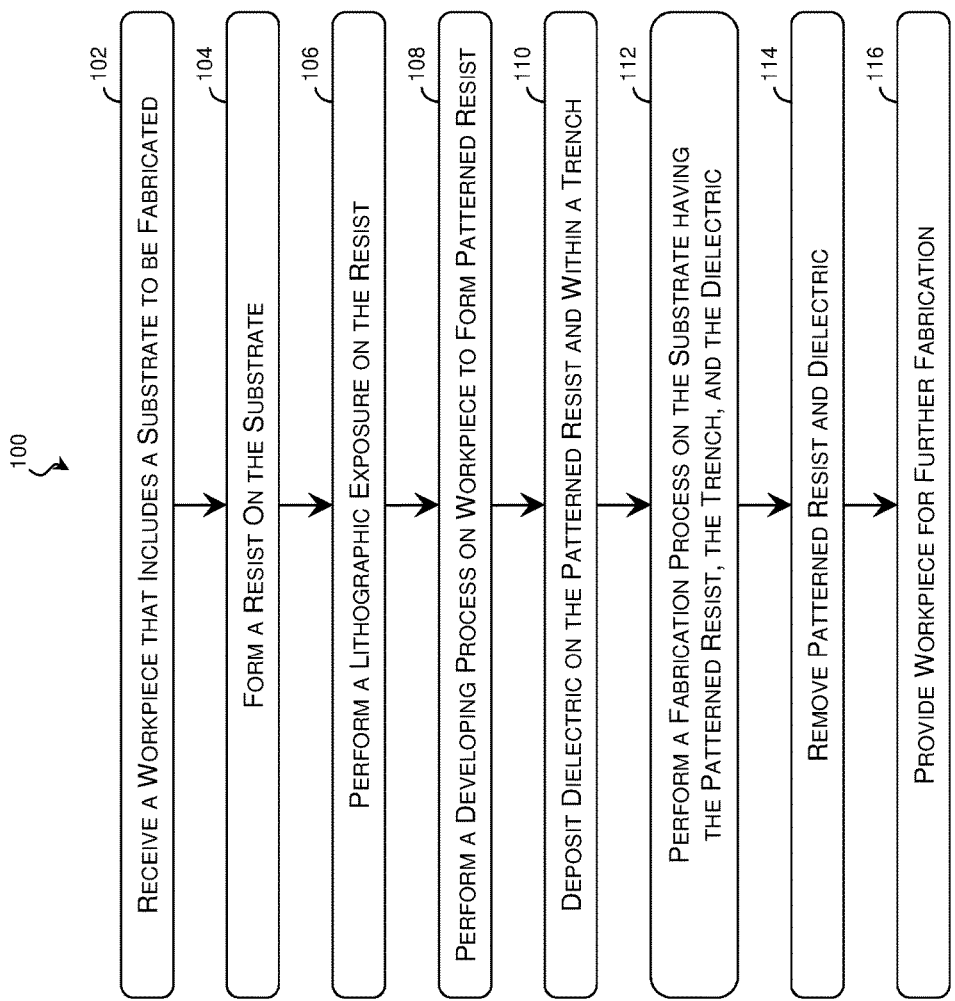

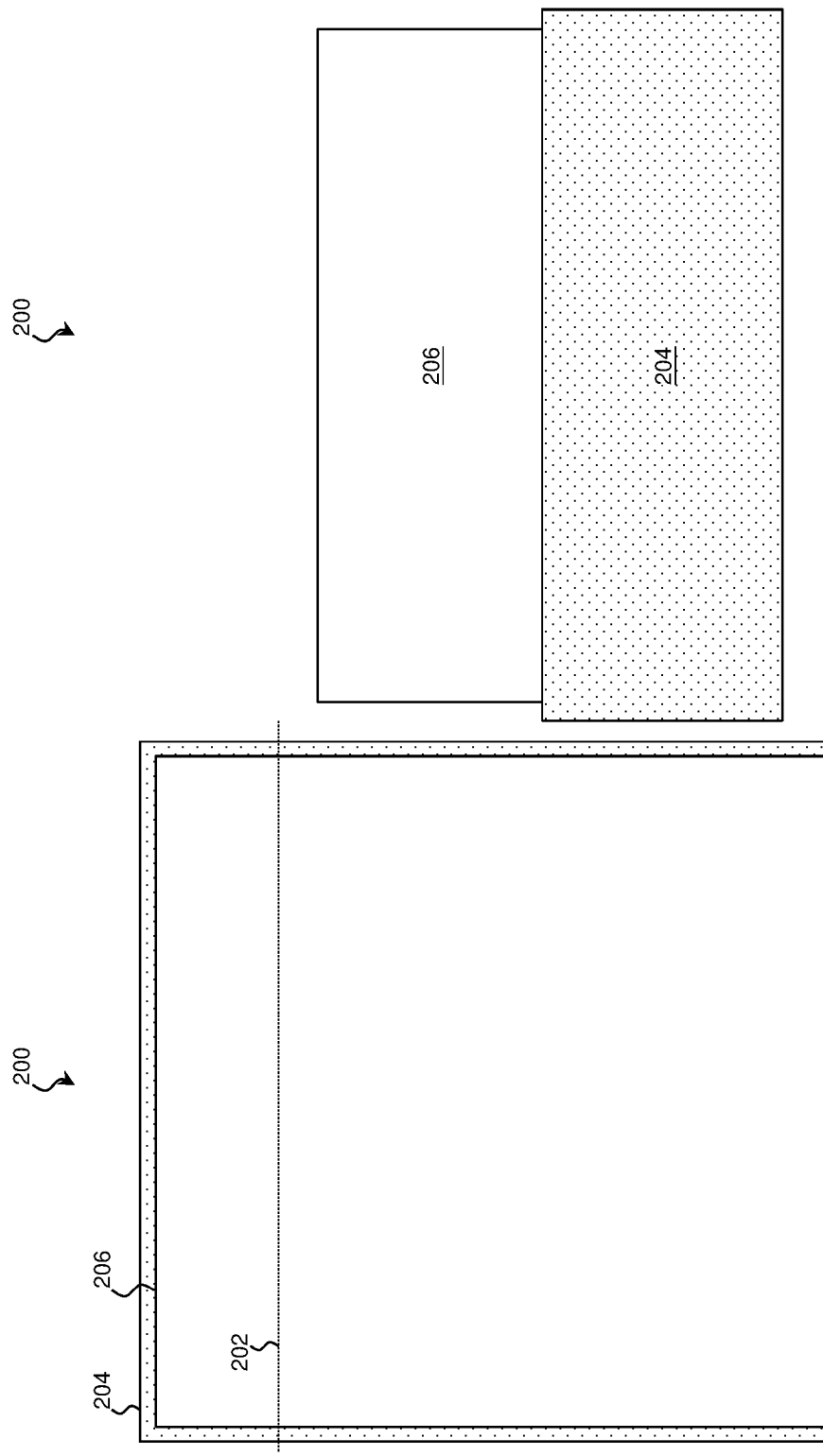

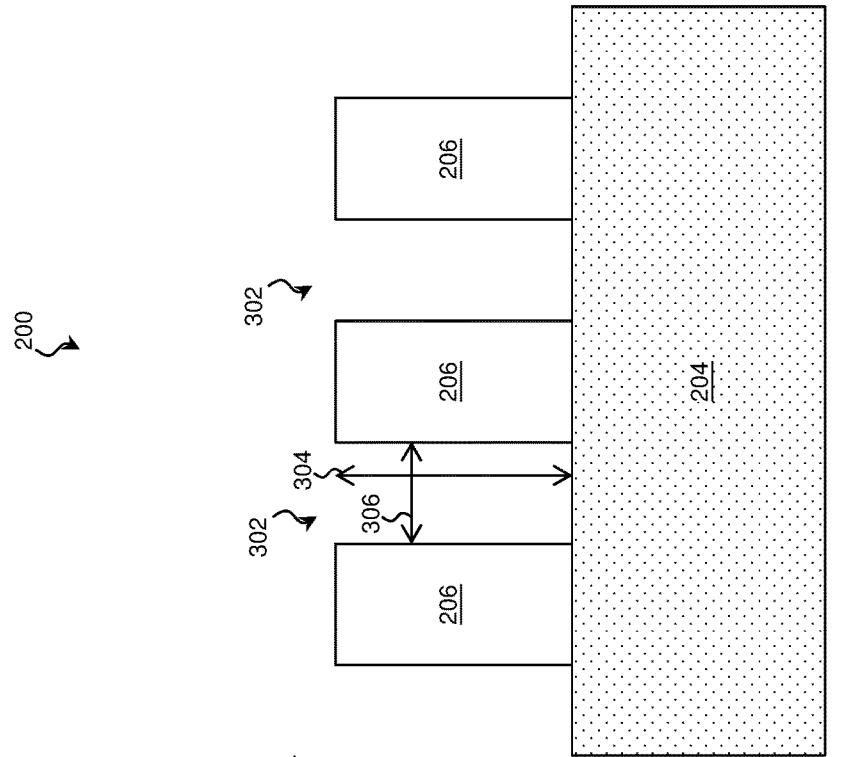
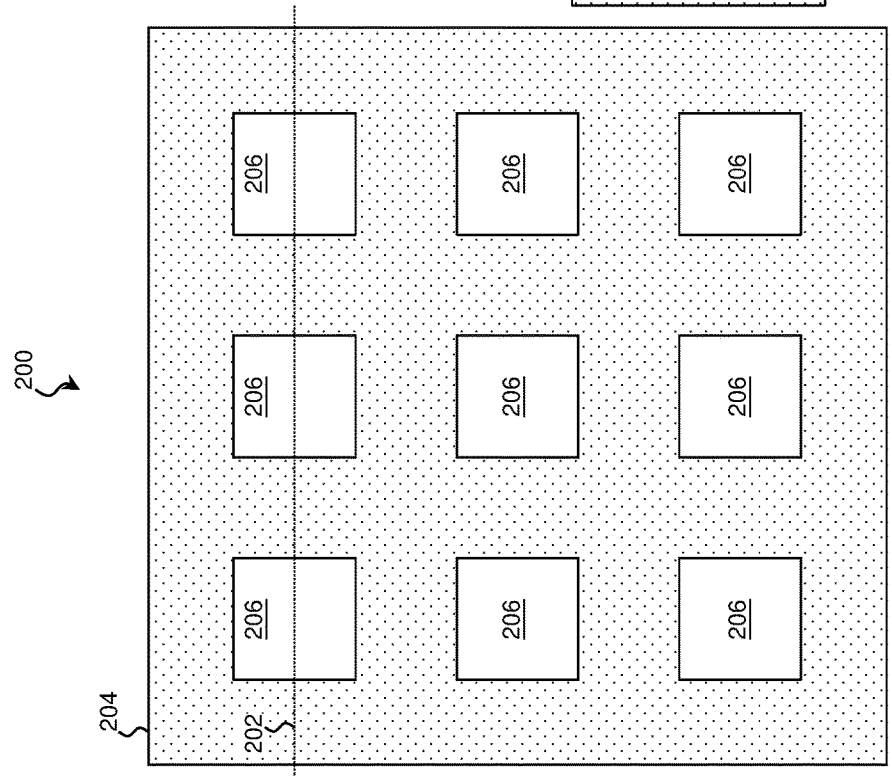
Fig. 3A
Fig. 3B

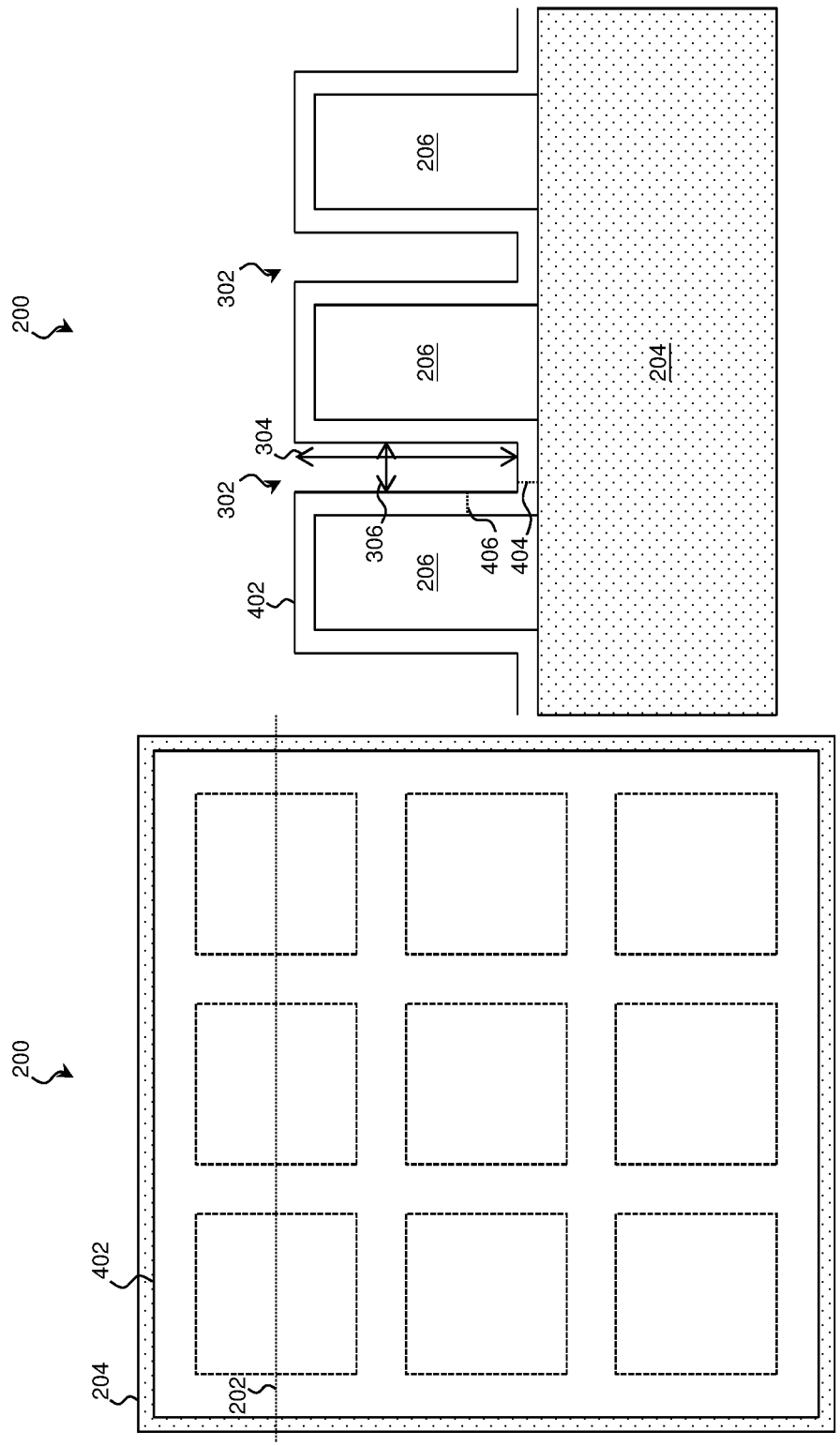

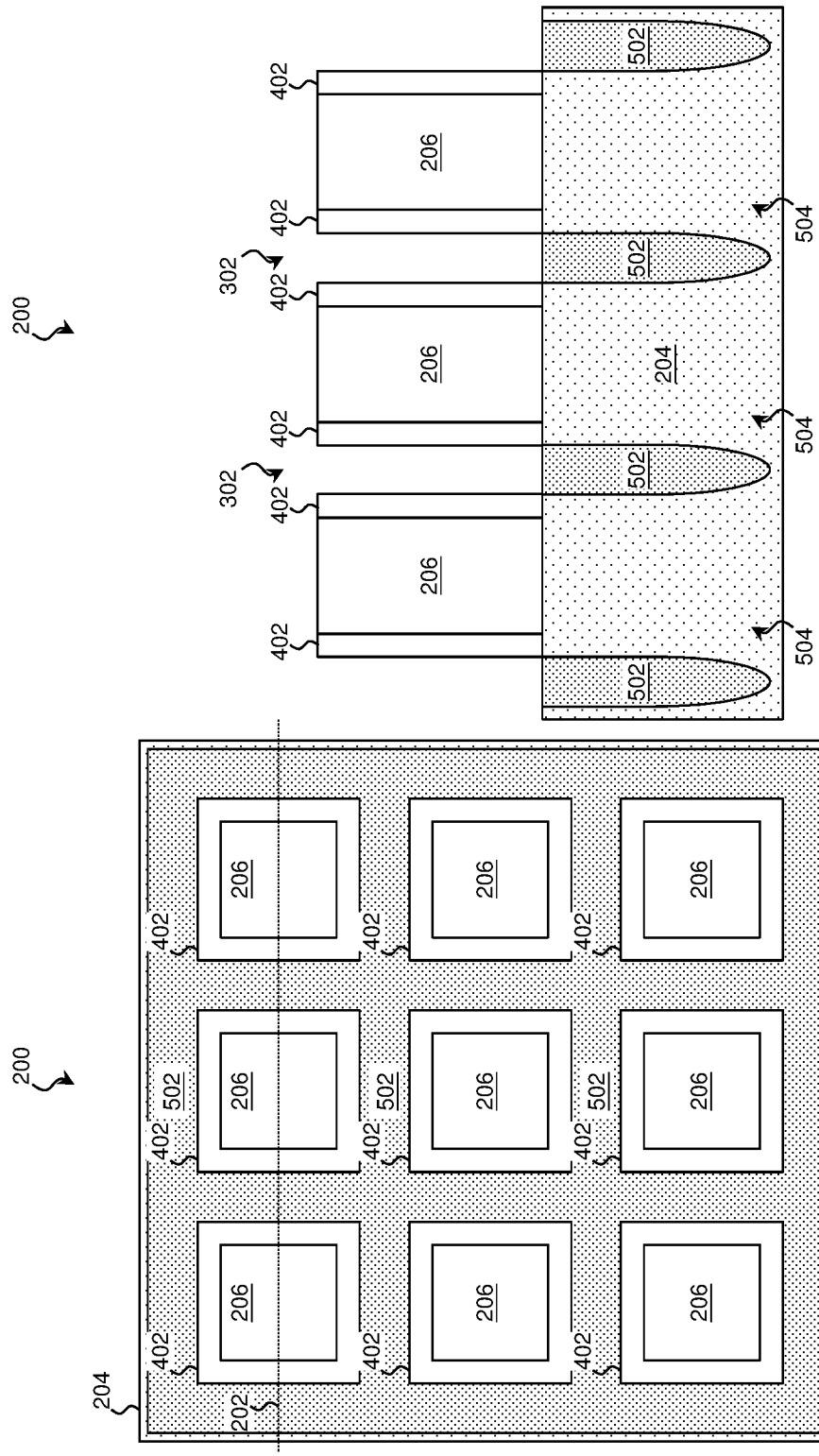

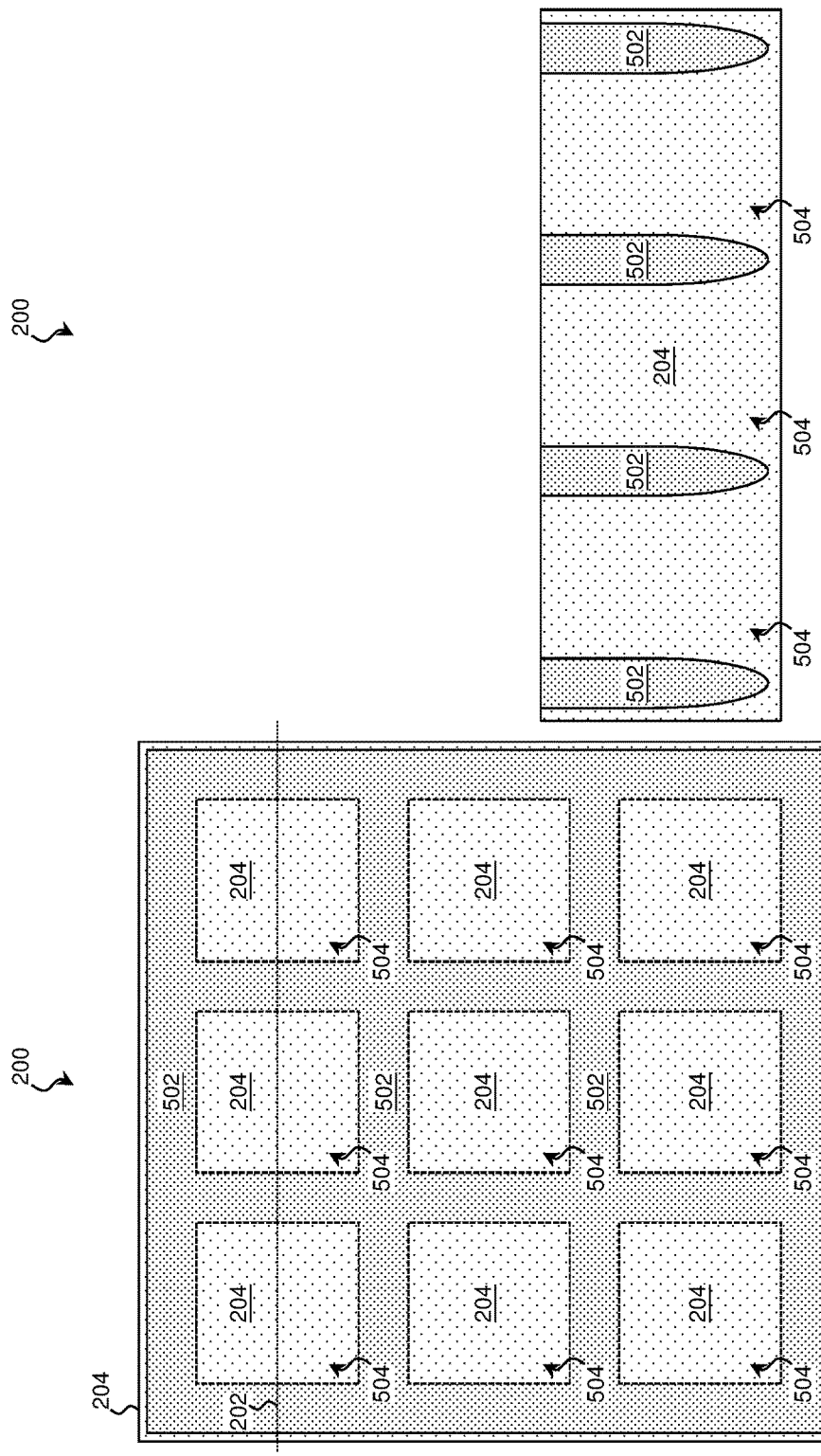

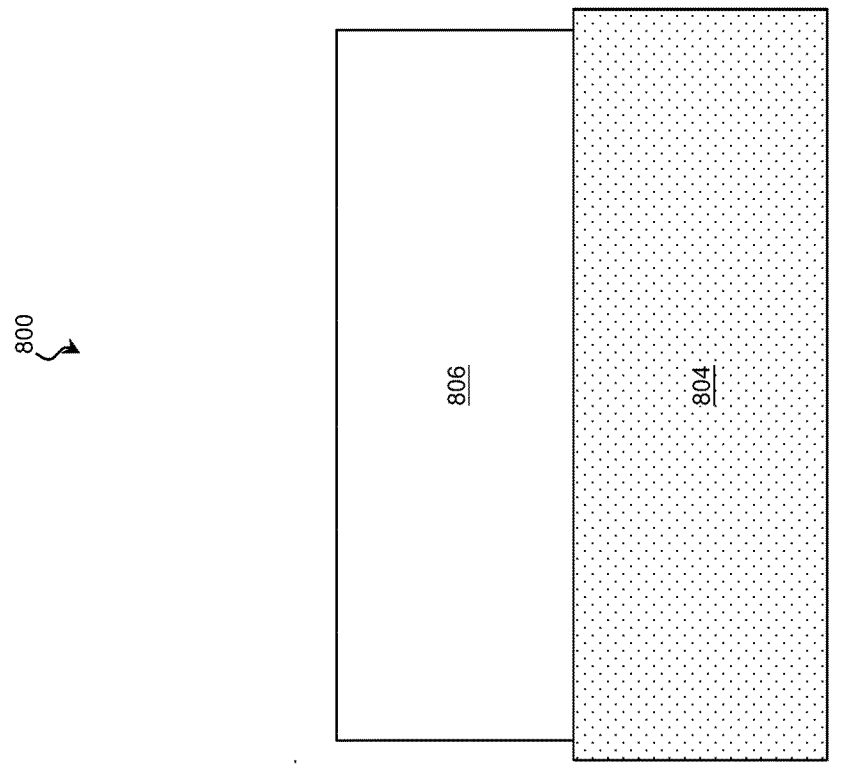
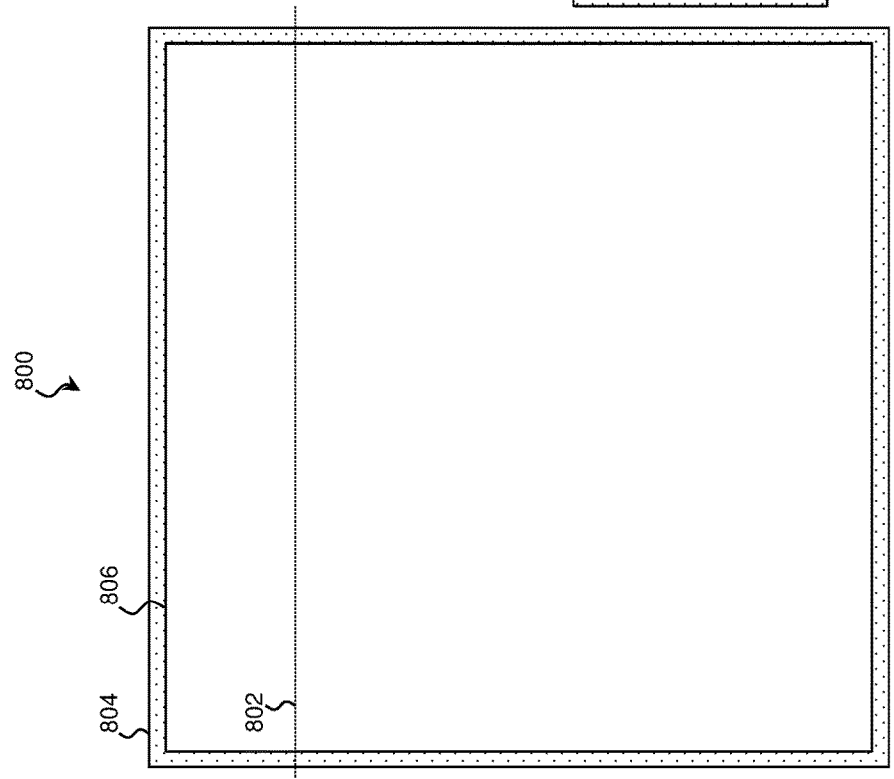
Fig. 8A
Fig. 8B

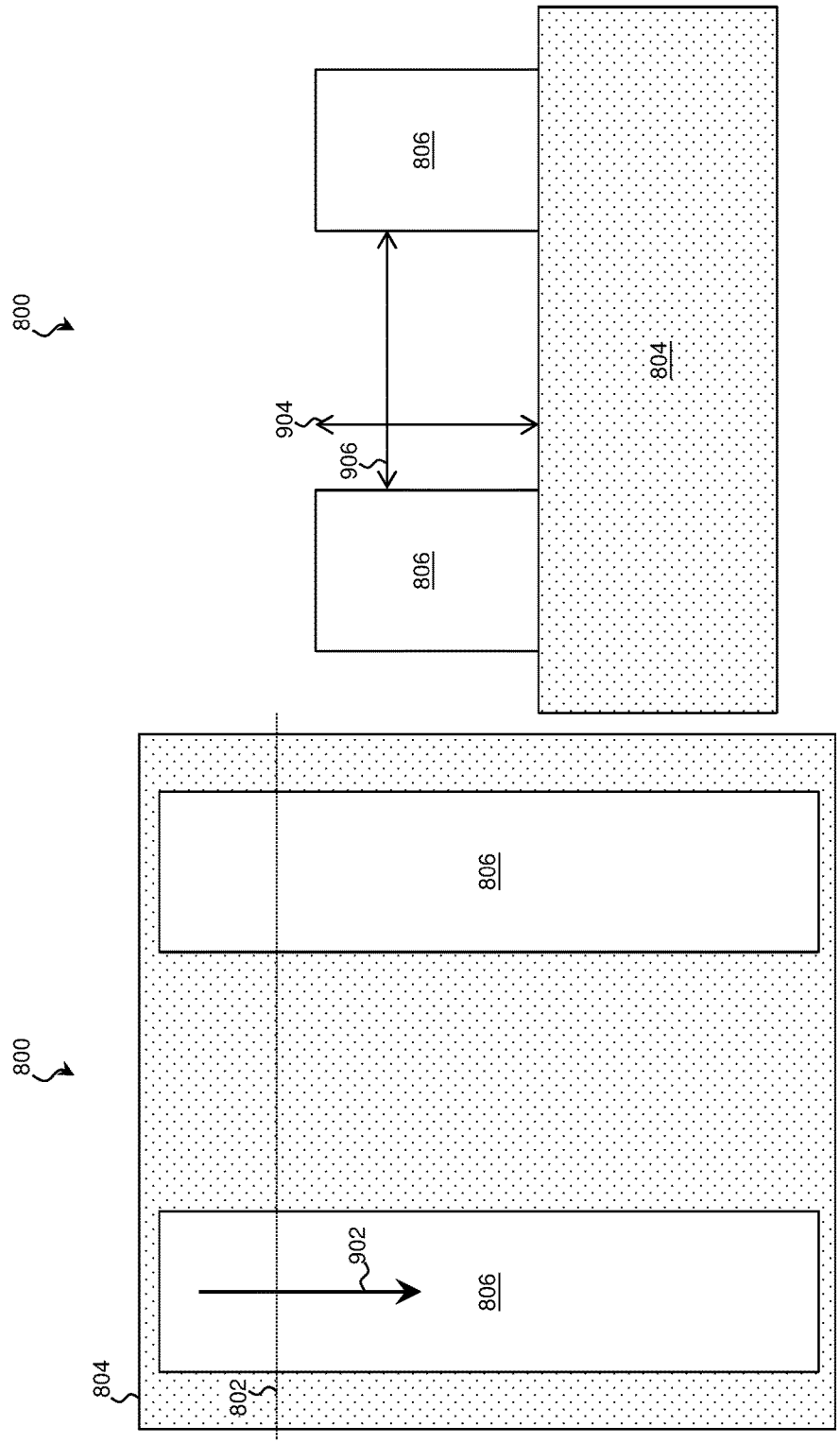

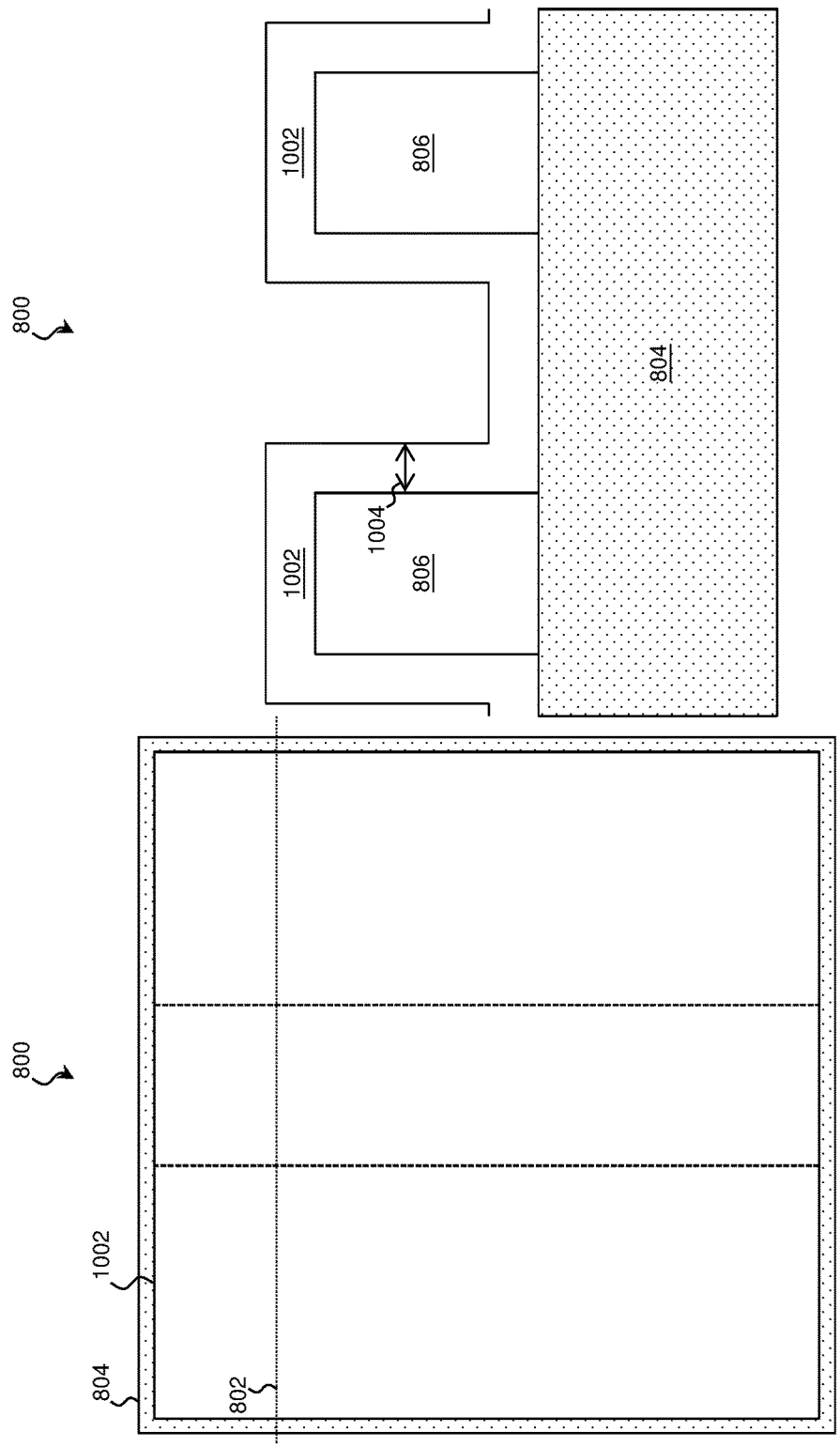

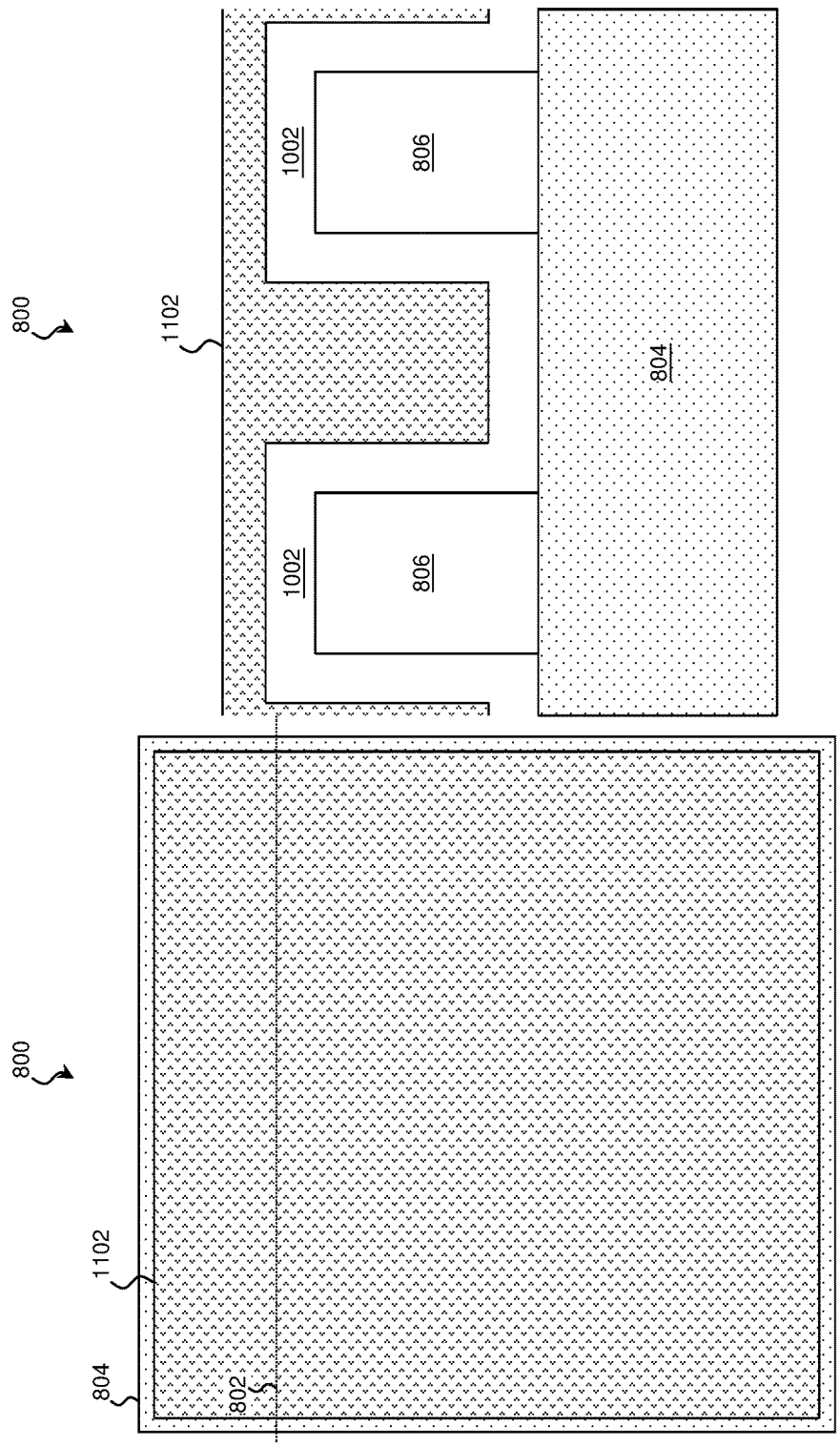

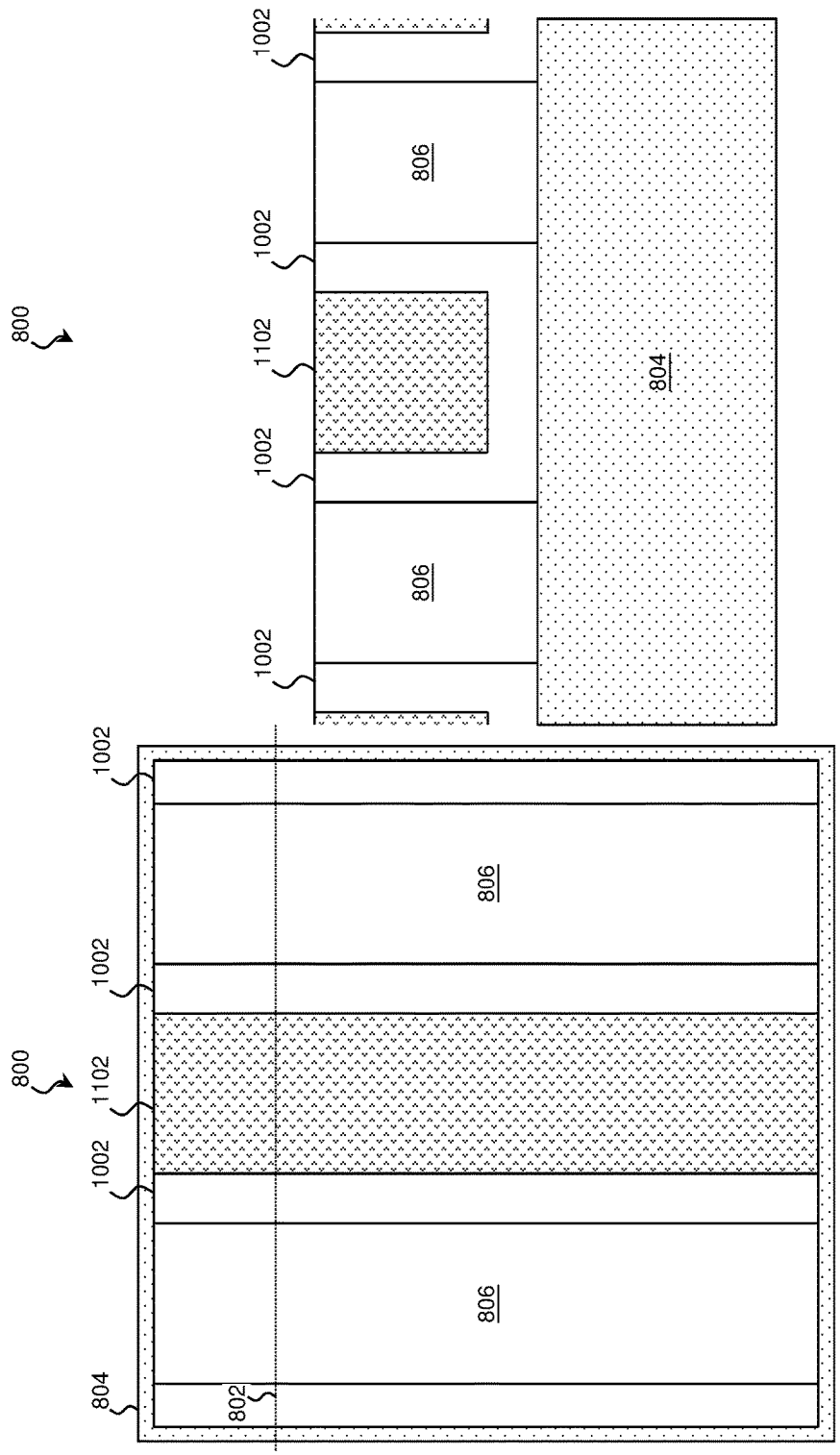

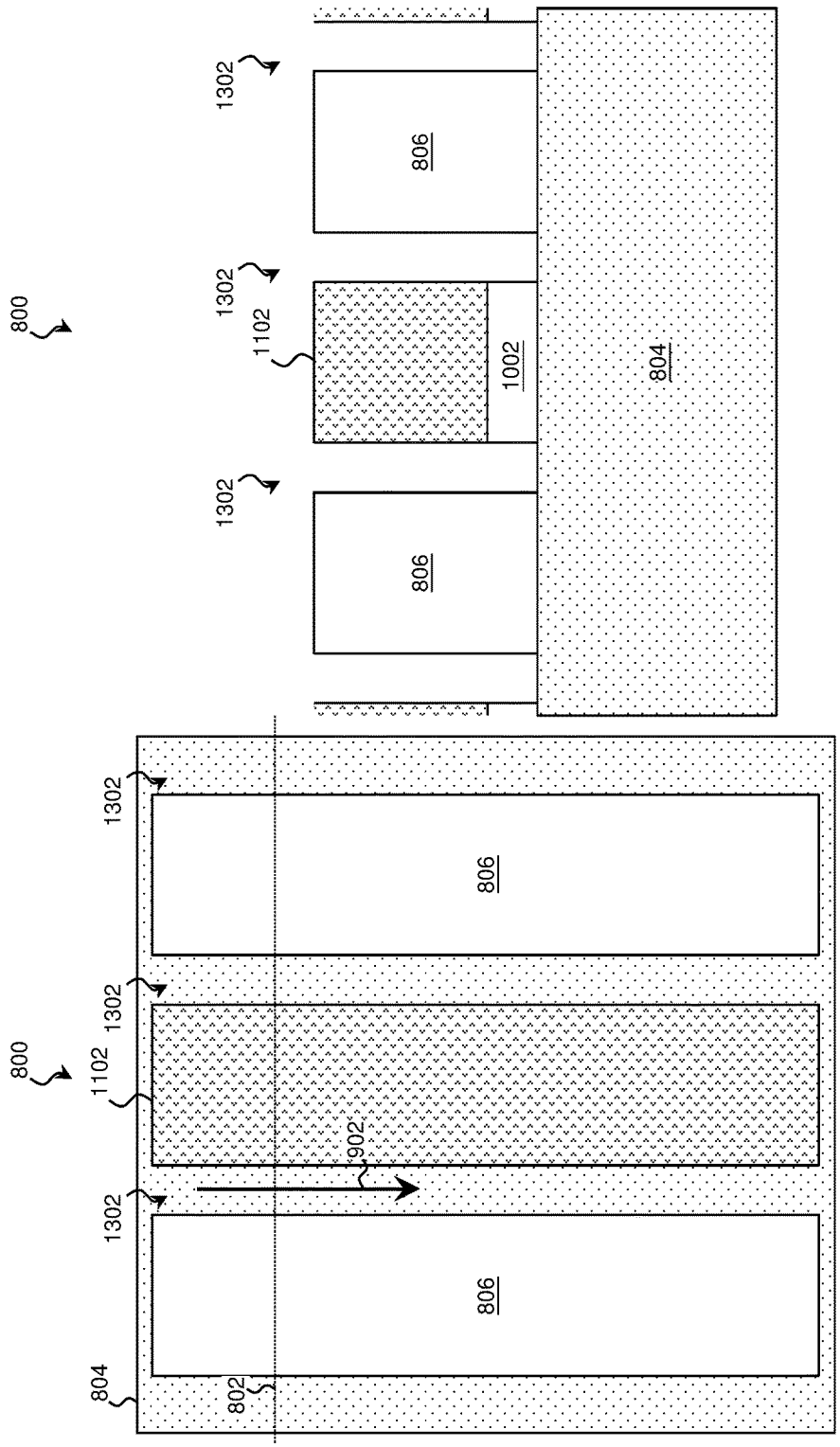

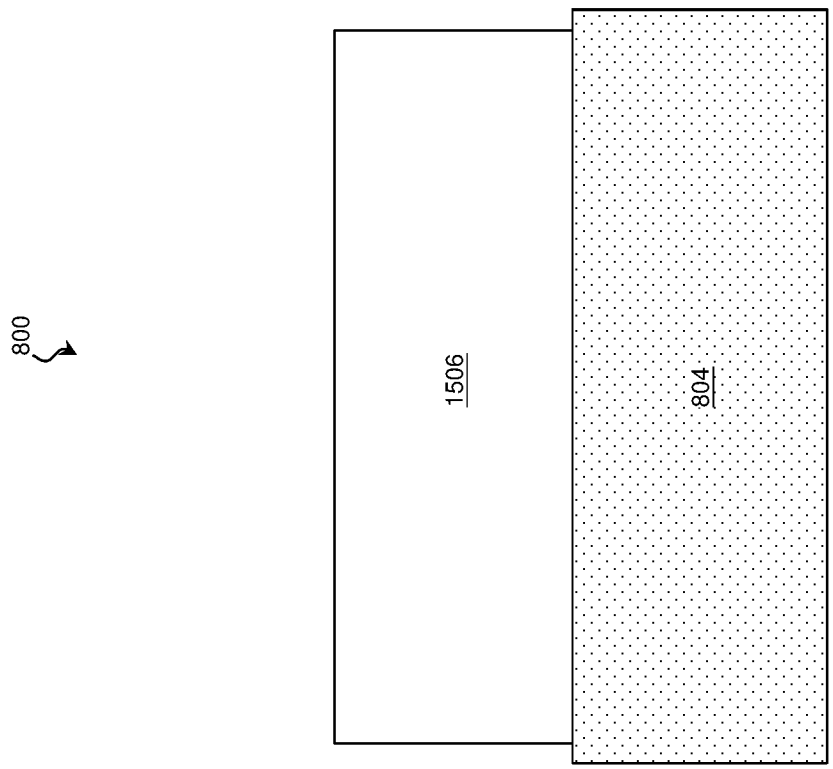
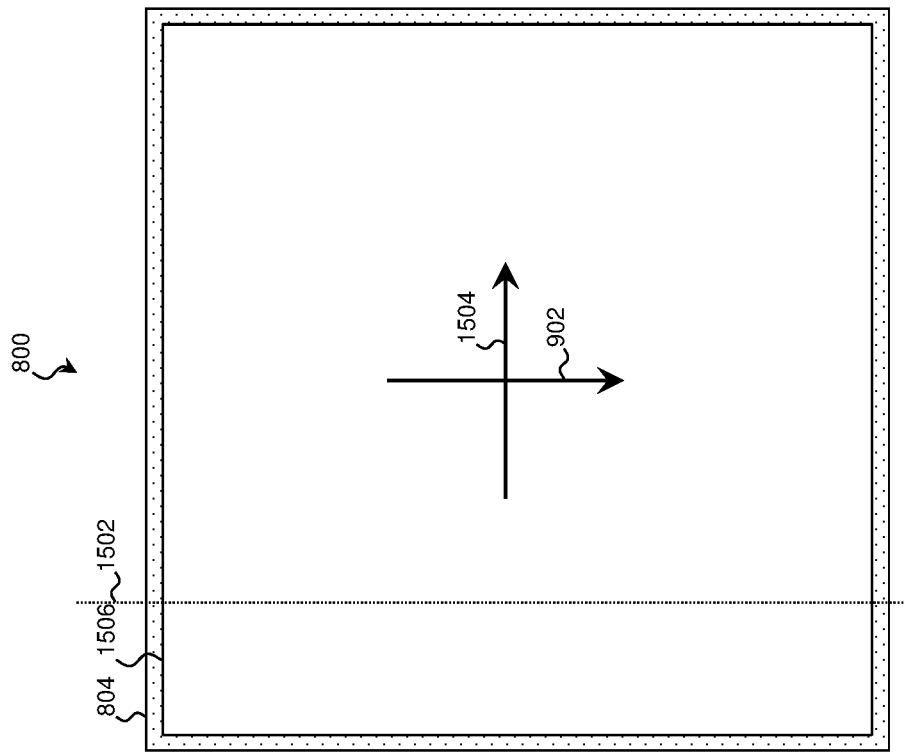

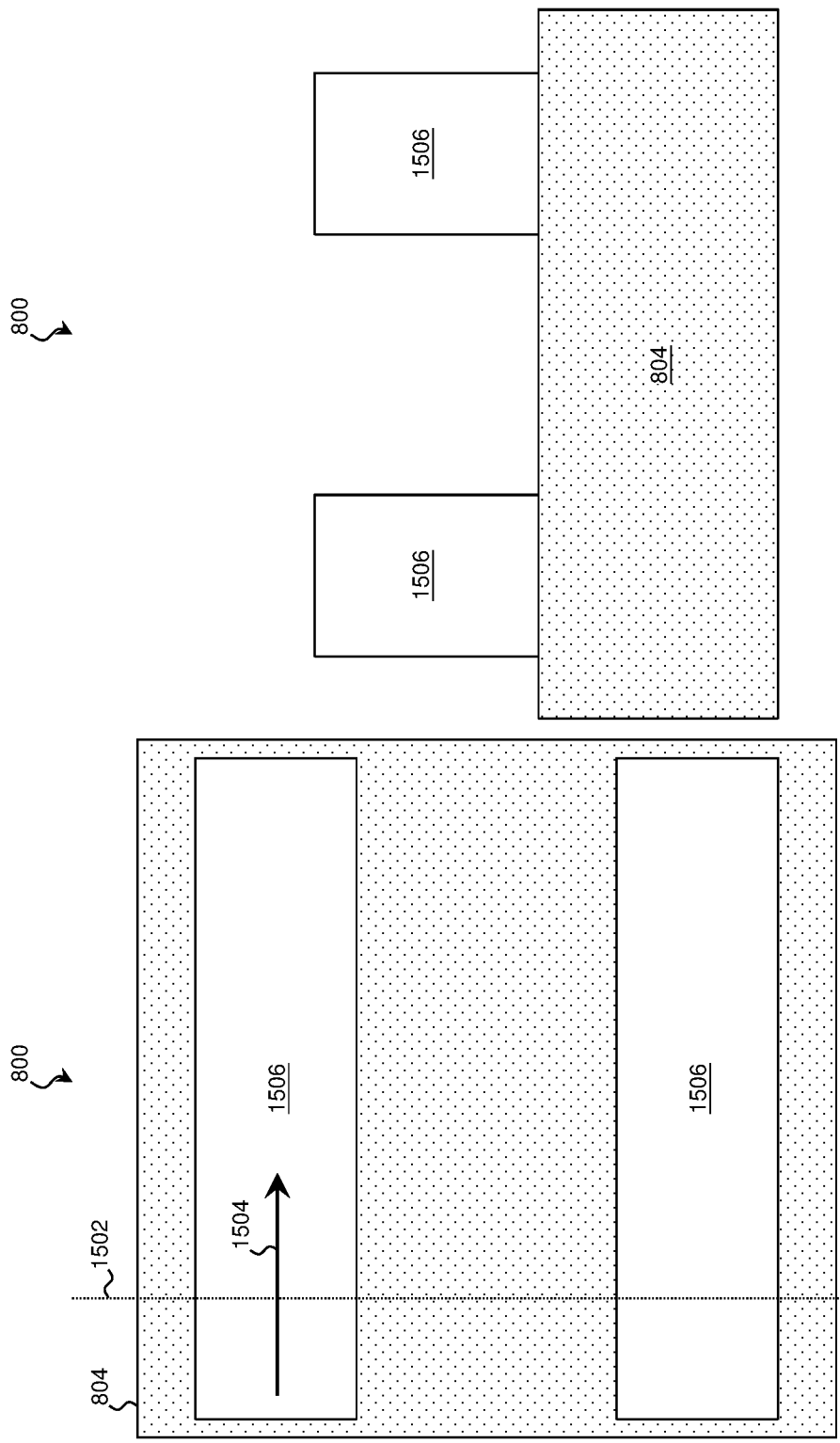

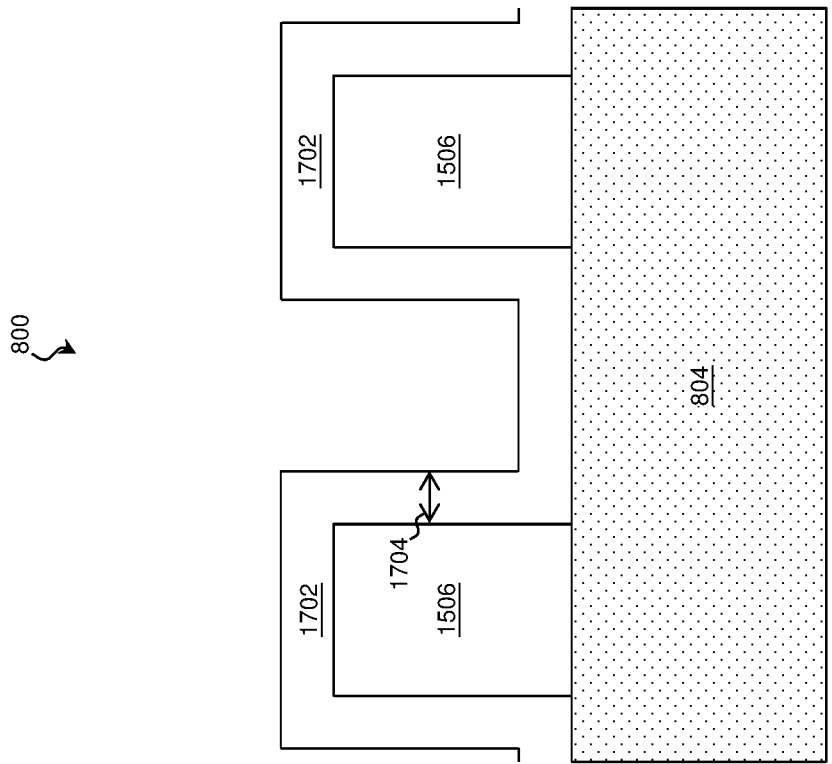
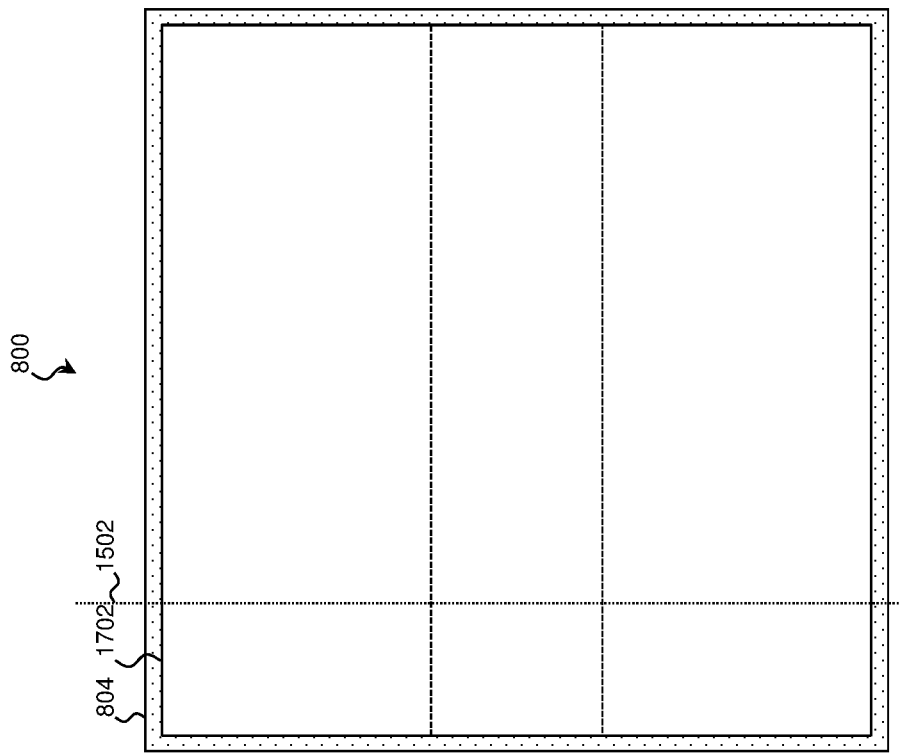

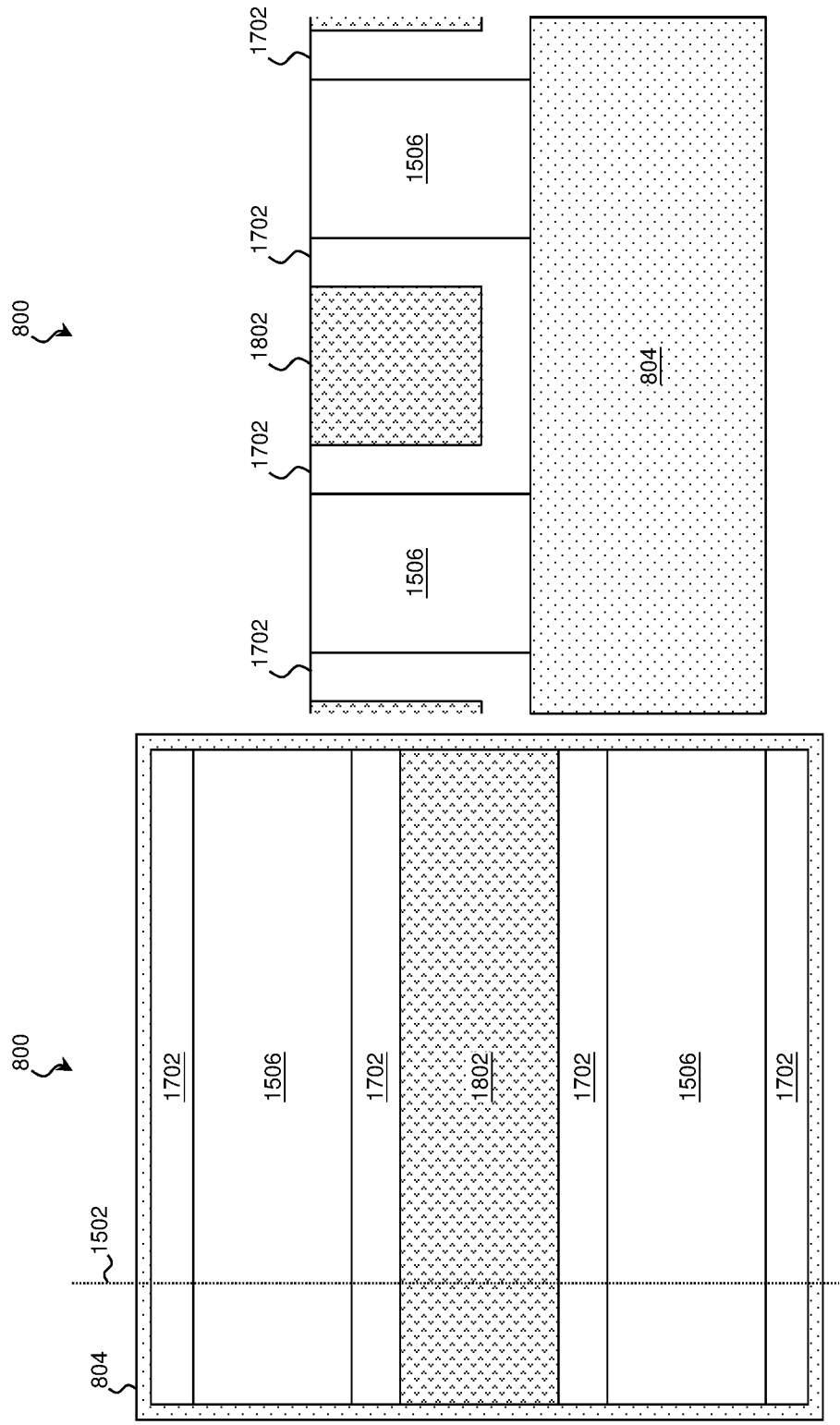

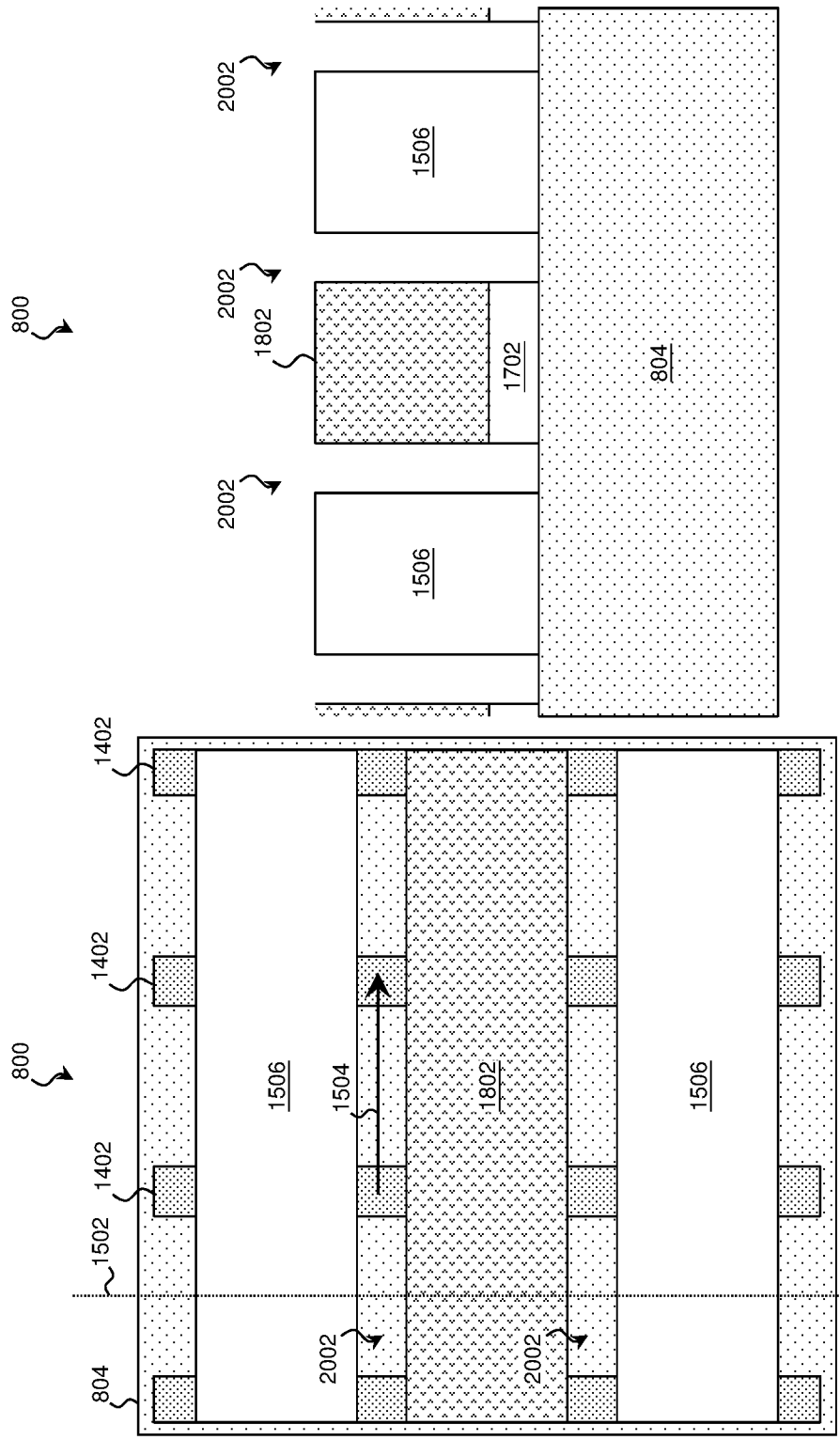

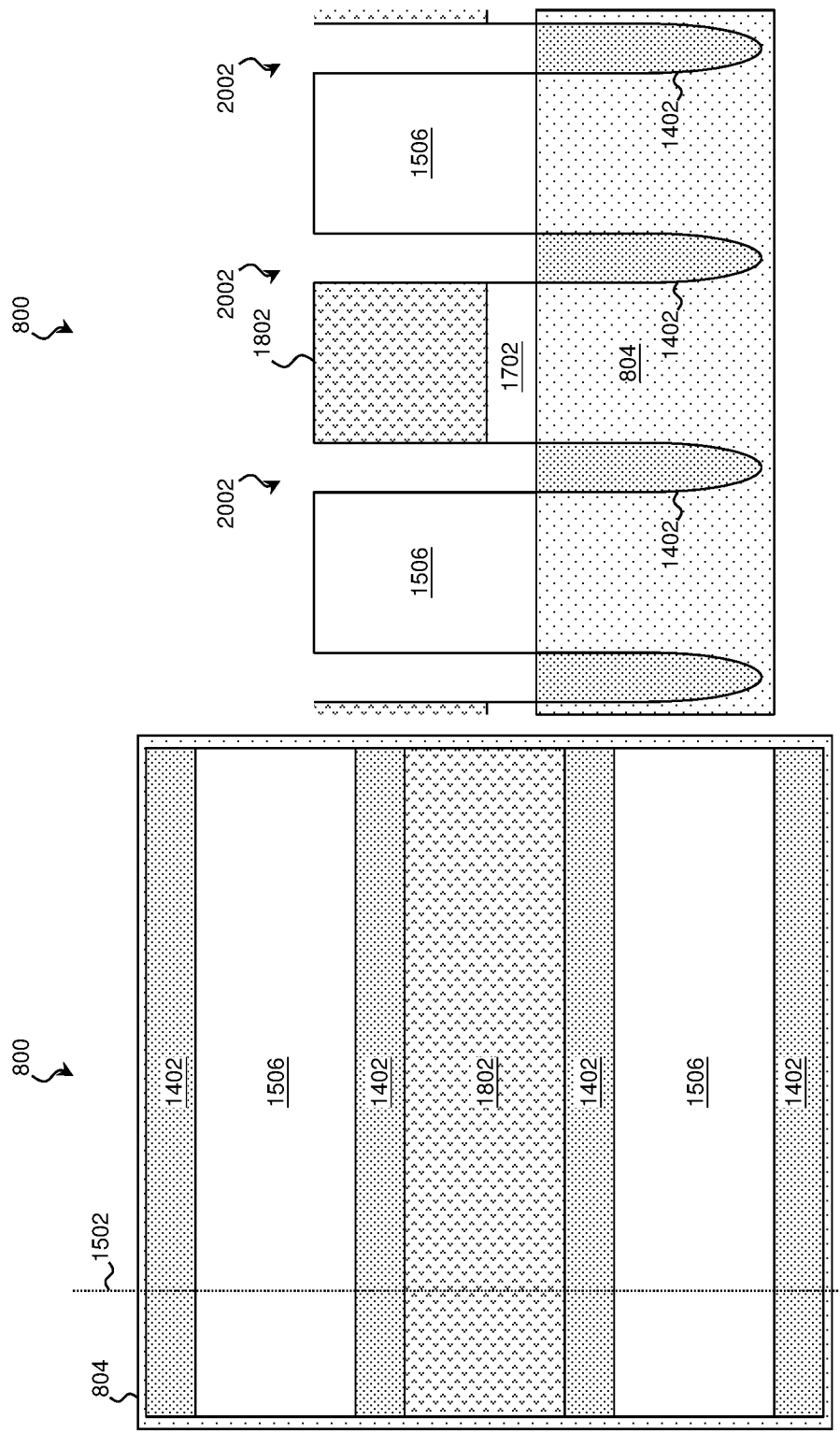

PATTERNING FOR SUBSTRATE FABRICATION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed these increasingly complex designs to be fabricated with precision and reliability.

As merely one example, advances in lithography have reduced the sizes of circuit devices and enabled the formation of increasingly complex structures. In general, lithography is the formation of a pattern on a target. In one type of lithography, referred to as photolithography, radiation such as ultraviolet light passes through or reflects off a mask before striking a photoresist coating on the target. The photoresist includes one or more components that undergo a chemical transition when exposed to radiation. A resultant change in property allows either the exposed or the unexposed portions of the photoresist to be selectively removed. In this way, photolithography transfers a pattern from the mask onto the photoresist, which is then selectively removed to reveal the pattern. The target then undergoes processing steps that take advantage of the shape of the remaining photoresist to create features on the target.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow diagram of a method of fabricating a workpiece according to various aspects of the present disclosure.

FIGS. 2A, 3A, 4A, 5A, 5C, and 6A are top-view diagrams of a workpiece at various stages of a method of fabricating the workpiece according to various aspects of the present disclosure.

FIGS. 2B, 3B, 4B, 5B, 5D, and 6B are cross-sectional diagrams of a workpiece at various stages of a method of fabricating the workpiece according to various aspects of the present disclosure.

FIGS. 8A, 9A, 10A, 11A, 12A, 13A, 14A, 15A, 16A, 17A, 18A, 19A, 20A, 21A, and 22A are top-view diagrams of a workpiece at various stages of a method of fabricating the workpiece according to various aspects of the present disclosure.

FIGS. 8B, 9B, 10B, 11B, 12B, 13B, 14B, 15B, 16B, 17B, 18B, 19B, 20B, 21B, and 22B are cross-sectional diagrams of a workpiece at various stages of a method of fabricating the workpiece according to various aspects of the present disclosure.

DETAILED DESCRIPTION

Figures 5A, 5B:
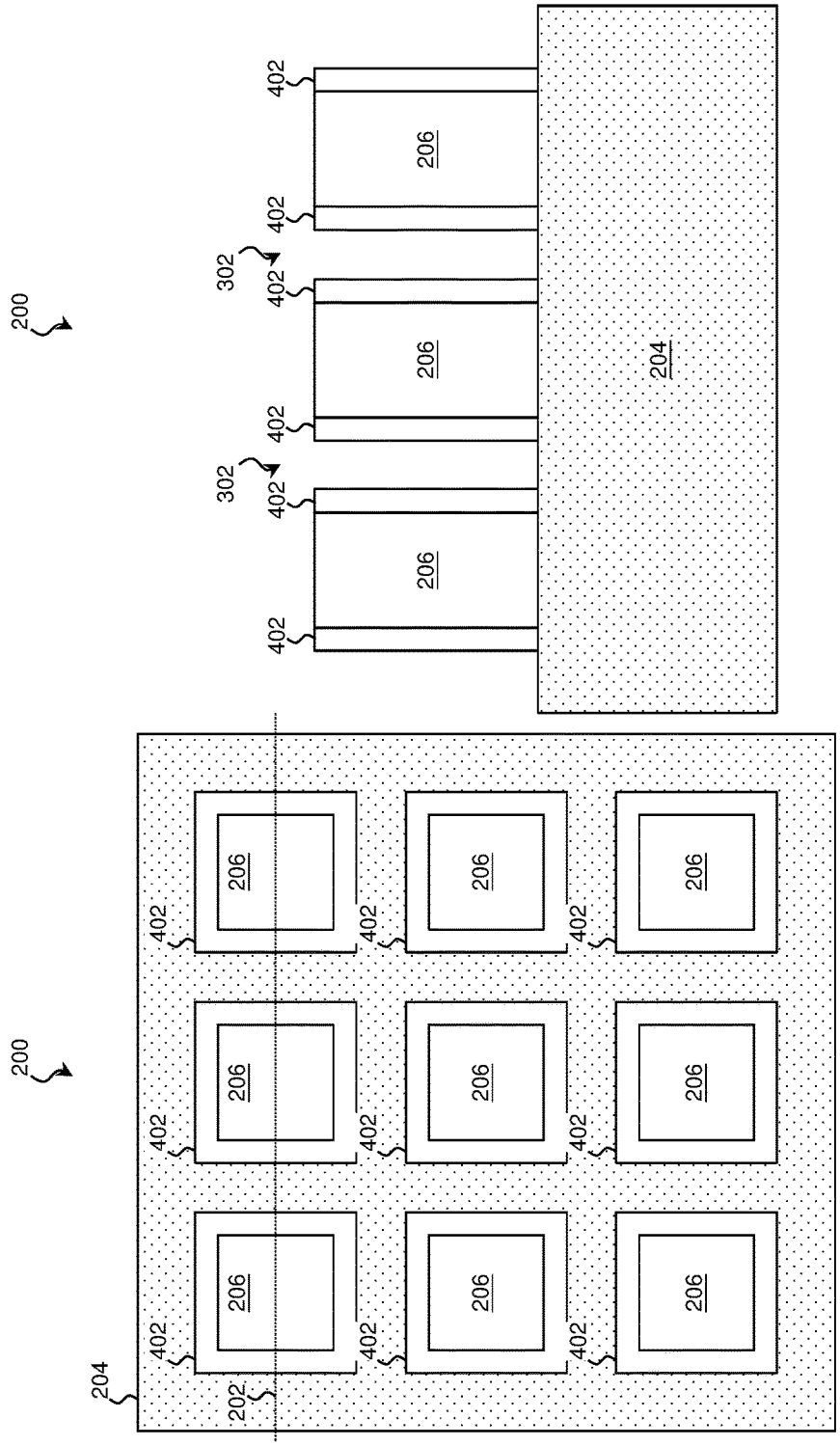

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As semiconductor fabrication technologies continue to evolve, device sizes continue to shrink, thereby pushing the limits of optics, chemistry, and physics. For example, device features may be formed on a substrate by first applying a resist material and lithographically exposing portions of the resist. A resultant change in property allows either the exposed or the unexposed portions of the resist to be selectively removed. A number of factors determine the minimum feature size that may be formed including capillary forces acting on the semisolid resist material. Capillary forces may draw portions of a developed resist together and cause the resist to collapse. This problem is exacerbated when a resist pattern has a tall and narrow (i.e., high aspect ratio) trench disposed in between resist features. Other properties of the lithographic system, the resist, and the developing process may also affect the quality of the resist at the trench boundaries. In turn, the quality of the resist boundaries determines the precision and uniformity of the features formed using the resist. In contrast, collapsed resist may lead to narrowing, necking, bridging, and other defects in the circuit. In this way and others, resist performance directly affects the critical dimension (CD) of integrated circuits and other aspects of circuit size and quality.

As described below, the present disclosure provides a technique to address these issues and to improve resist performance. However, unless otherwise noted, no embodiment is required to provide any particular advantage or to resolve any particular aspect of resist collapse.

Some examples of the technique are described with reference to FIGS. 1-6B. In that regard, FIG. 1 is a flow diagram of a method 100 of fabricating a workpiece according to various aspects of the present disclosure. Additional steps can be provided before, during, and after the method 100, and some of the steps described can be replaced or eliminated for other embodiments of the method 100. FIGS. 2A, 3A, 4A, 5A, 5C, and 6A are top-view diagrams of the workpiece 200 at various stages of the method 100 of fabricating the workpiece 200 according to various aspects of the present disclosure. FIGS. 2B, 3B, 4B, 5B, 5D, and 6B are cross-sectional diagrams of the workpiece 200 at various stages of the method 100 of fabricating the workpiece 200 according to various aspects of the present disclosure. In particular, FIGS. 2B, 3B, 4B, 5B, 5D, and 6B are cross-sections taken along line 202 of the corresponding top-view diagrams.

Referring first to block 102 of FIG. 1 and to FIGS. 2A and 2B, a workpiece 200 is received that includes a substrate 204 that is to undergo a fabrication process. The manufacture of integrated circuits includes a wide array of fabrication processes including implantation processes, etching processes, deposition processes, and epitaxy processes, and any number of these processes and others may be performed on the substrate 204. In order to selectively process portions of the substrate 204, a resist and/or masking materials may be deposited on the substrate and patterned to expose only the portions to be processed (e.g., implanted, etched, etc.), as explained in further detail below.

With respect to the substrate 204 itself, in various examples, the substrate 204 comprises an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. The substrate 204 may include one or more layers of varying composition, such as a Silicon-On-Insulator (SOI) substrate 204 that includes a semiconductor layer disposed on an insulator layer that is disposed on another semiconductor layer.

Referring to block 104 of FIG. 1 and referring still to FIGS. 2A and 2B, a resist 206 is formed on the substrate 204. The resist 206 represents any resist material, and in many embodiments, the resist 206 includes a photoresist material sensitive to radiation such as UV light, deep ultraviolet (DUV) radiation, and/or EUV radiation. However, the principles of the present disclosure apply equally to e-beam resists and other direct-write resist materials. The resist 206 may be applied by any suitable technique, and an exemplary embodiment, the resist 206 is applied in a liquid form using a spin coating (i.e., spin-on) technique. Spin coating may use centrifugal force to disperse the resist 206 in a liquid form across the surface of the substrate 204 in a substantially uniform thickness. To facilitate application, the resist 206 may include a solvent, which when removed, leaves the resist 206 in a solid or semisolid form. The solvent may be driven off as part of the spin coating, during a settling process, and/or during a post-application/pre-exposure baking (i.e., prebake) process.

Regarding its composition, the resist 206 may include one or more photosensitive materials. For example, the resist 206 may include a photo-acid generator (PAG) that, as the name implies, generates an acid within those portions of the resist 206 exposed to radiation. A polymer within the resist 206, such as an acid-cleavable polymer or acid-cross-linkable polymer, is sensitive to this generated acid, causing the portion of the polymer in the exposed regions to undergo a chemical reaction. The resist 206 may also include a photobase generator (PBG) and/or photo-decomposable quencher (PDQ) to reduce acid concentration in unexposed or marginally-exposed regions of the resist 206 and thereby inhibit the chemical reaction of the polymer in these regions. In some embodiments, the resist 206 also includes one or more chromophores, solvents, and/or surfactants.

Referring to block 106 of FIG. 1, a lithographic exposure is performed on the workpiece 200 that exposes selected regions of the resist 206 to radiation. Suitable radiation includes UV light, deep ultraviolet (DUV) radiation, and/or EUV radiation. In further examples, the selected regions are exposed to an e-beam or ion beam. In these cases and others, the exposure of block 106 causes a chemical reaction to occur in the exposed regions of the resist 206.

Referring to block 108 of FIG. 1 and to FIGS. 3A and 3B, a developing process is performed on the workpiece 200 to form a patterned resist 206. The developing process may begin with a post-exposure bake. Following the post-exposure bake, a developer is applied to the workpiece 200. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene.

After the developer is applied to the workpiece 200, the patterned resist 206 may be rinsed, and a hard bake may be performed on the workpiece 200 to further stabilize the pattern of the resist 206.

The pattern of the resist 206 after developing may have any suitable shape and structure and may include features of resist 206 separated by trenches 302. In some embodiments, the pattern is governed by the stability of the resist 206, limitations of a lithographic system used to pattern the resist 206, fabrication processes to be performed using the resist 206, and/or other factors. For example, capillary action and other forces may cause the features of the resist 206 to collapse if a narrow trench is formed between the features. Accordingly, in some such embodiments, the pattern is structured to limit the ratio of trench height (as indicated by marker 304) to trench width (as indicated by marker 306) to a particular threshold (e.g., a ratio of ≤10). The particular threshold may depend on a number of factors including resist stability and other properties of the resist 206, properties of the substrate 204, and/or properties of a subsequent fabrication processes that may induce the resist 206 to collapse, such as processing temperature.

While the ratio threshold may seem to imply that a narrower trench may be formed by simply thinning the resist 206, in some applications, a fabrication process that follows relies on a particular minimum thickness of the resist 206. For example, an ion implantation process may rely on the resist 206 having at least a minimum thickness to block the ions from reaching the substrate 204. Likewise, an etching process may rely on the resist 206 having at least a minimum thickness to withstand an etchant long enough to etch the exposed portions of the substrate 204.

Accordingly, to produce a narrow aspect ratio, in some embodiments, a wider trench is formed and then narrowed by conformally depositing a material within the trench. Referring to block 110 of FIG. 1 and to FIGS. 4A and 4B, a dielectric material 402 is deposited on the developed resist 206 and within the trenches 302 between the features of the resist 206. The dielectric material 402 may include a semiconductor oxide, a semiconductor nitride, a semiconductor oxynitride, a semiconductor carbide, and/or other suitable insulator materials, and may be formed to any suitable thickness. In some examples, the dielectric material 402 includes silicon oxide and is formed to a vertical thickness 404 and a horizontal vertical thickness 406 of between about 50 nm and about 100 nm. The dielectric material 402 may be deposited conformally such that the vertical thickness 404 and horizontal vertical thickness 406 are substantially equivalent, or non-conformally. As can be seen, forming the dielectric material 402 with a given thickness in a trench reduces the width of the trench by about twice the horizontal thickness 406 of the dielectric material 402. Thus, in some embodiments, the deposition of the dielectric material 402 allows for forming trenches with a height/width ratio greater than using the resist 206 alone. In one such embodiment, deposition of the dielectric material 402 creates suitable trenches 302 with a ratio of trench height to trench width that is ≥13.

The dielectric material 402 may be deposited using any suitable technique. In some examples, the dielectric material 402 is deposited using a catalyst deposition process such as Catalyst Enhanced Chemical Vapor Deposition (CECVD). In some examples, the dielectric material 402 is deposited using Plasma Enhanced CVD (PECVD). The deposition technique may be tuned to produce any suitable deposition rate, and in various examples, the deposition rate for the dielectric material 402 is between about 1 Å and about 10 Å per minute. The deposition process may be performed at any suitable temperature. In some examples, the dielectric material 402 is deposited at a temperature between about 50° C. and about 100° C. or between about room temperature (~20° C.) and about 100° C. Regarding the lower bound, these ranges have been determined to be sufficiently warm to promote deposition of the dielectric material 402, which may be inhibited by temperatures below these ranges. Regarding the upper bound, some resist 206 materials deform at deposition temperatures exceeding 100° C. Accordingly, performing deposition at the above temperature ranges allows the dielectric material 402 to be deposited without risk to the resist 206 material.

Referring to block 112 of FIG. 1 and to FIGS. 5A, 5B, 5C, and 5D, a fabrication process is performed on the workpiece 200. The fabrication process may be any suitable process and may utilize the patterned resist 206 to processes exposed portions of the substrate 204 differently from those portions covered by the resist 206. For example, the fabrication process may include an ion implantation process to form a junction isolation structure 502 in the substrate 204. The junction isolation structure 502 is suitable to isolate pixel regions 504 of an image sensor or devices of other integrated circuits. A junction isolation structure 502 isolates circuit elements by creating a reverse biased p-n junction between the elements. Accordingly, the implantation process may implant ions of p-type dopants, such as boron or $BF_2$, into a substrate 204 that contains n-type dopants, such as phosphorus or arsenic, or may implant ions of n-type dopants into a substrate 204 that contains p-type dopants.

The implantation process may be performed using any suitable implantation energy, and the thickness and composition of the resist 206 and the dielectric material 402 may be configured such that the ions have sufficient energy that they are implanted through the single thickness of the dielectric material 402 at the bottom of the trench 302 but not enough to implant through the resist 206 or through the dielectric material 402 on the sidewalls of the trench 302. Additionally or in the alternative, the dielectric material 402 at the bottom of the trench 302 may be removed prior to the implantation. Referring to FIGS. 5A and 5B, in an example, an anisotropic (directional) etching is performed to remove the dielectric material 402 from the bottom of the trench 302 while leaving the dielectric material 402 on the side surfaces of the resist 206. The anisotropic etching may also remove the dielectric material 402 from the top surface of the resist 206. Any suitable anisotropic etching technique may be used such as a dry or plasma etching technique. With the dielectric material 402 removed from the bottom of the trench 302, the above implantation process may be performed on the substrate 204 with enough implantation energy to form the junction isolation structure 502 but not enough to implant through the resist 206 or through the dielectric material 402 on the sidewalls of the trench 302, as shown in FIGS. 5C and 5D.

In further embodiments, the fabrication process includes an ion implantation process to produce other types of features such as source/drain regions. In yet further embodiments, the fabrication process of block 112 includes etching processes, deposition processes, epitaxy processes, and/or other suitable processes. In these embodiments and others, the patterned resist 206 and dielectric material 402 are used to fabricate a gate stack, to fabricate an interconnect structure, to form non-planar devices by etching to expose a fin or by epitaxially growing fin material, and/or to form other suitable features.

Referring to block 114 of FIG. 1 and to FIGS. 6A and 6B, the dielectric material 402 is removed and the resist 206 is stripped. These materials may be removed by any suitable etching and/or stripping technique such as dry etching, wet etching, and/or other etching methods (e.g., Reactive Ion Etching (RIE), Chemical Mechanical Polishing/Planarization (CMP), etc.), and the dielectric material 402 and resist 206 may be removed concurrently or in multiple steps with different chemistries targeting different materials.

Referring to block 116, the workpiece 200 is provided for further fabrication processes. For example, the workpiece 200 may be used to fabricate an image sensor, other integrated circuit chip, a System-On-a-Chip (SOC), and/or a portion thereof, and thus the subsequent fabrication processes may form various passive and active microelectronic devices such as sensors, resistors, capacitors, inductors, diodes, Metal-Oxide Semiconductor Field Effect Transistors (MOSFET), Complementary Metal-Oxide Semiconductor (CMOS) transistors, Bipolar Junction Transistors (BJT), Laterally Diffused MOS (LDMOS) transistors, high power MOS transistors, other types of transistors, and/or other circuit elements.

Figure 7A:
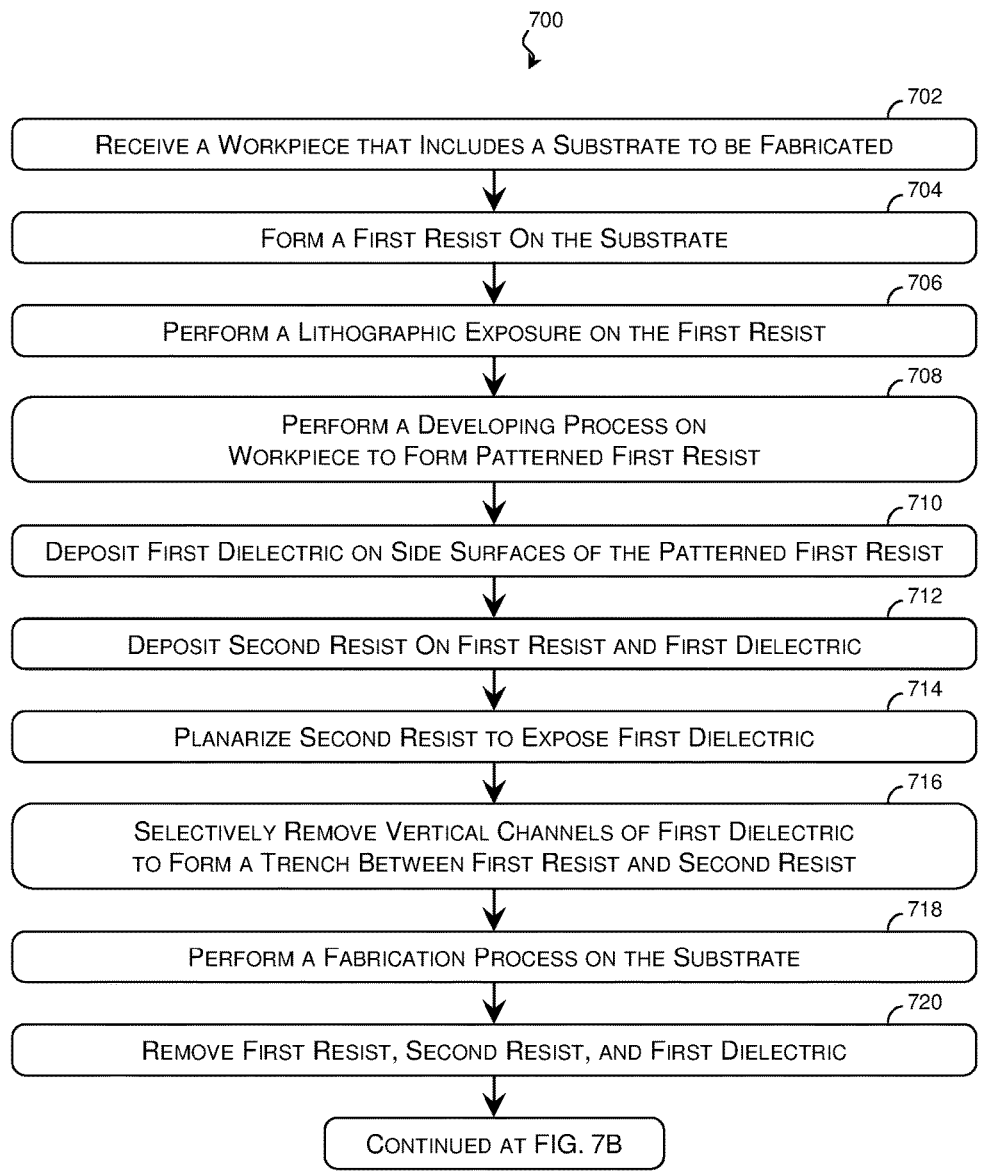
FIGS. 7A and 7B are flow diagrams of a method of fabricating a workpiece using orthogonal features according to various aspects of the present disclosure.
Figure 7B:
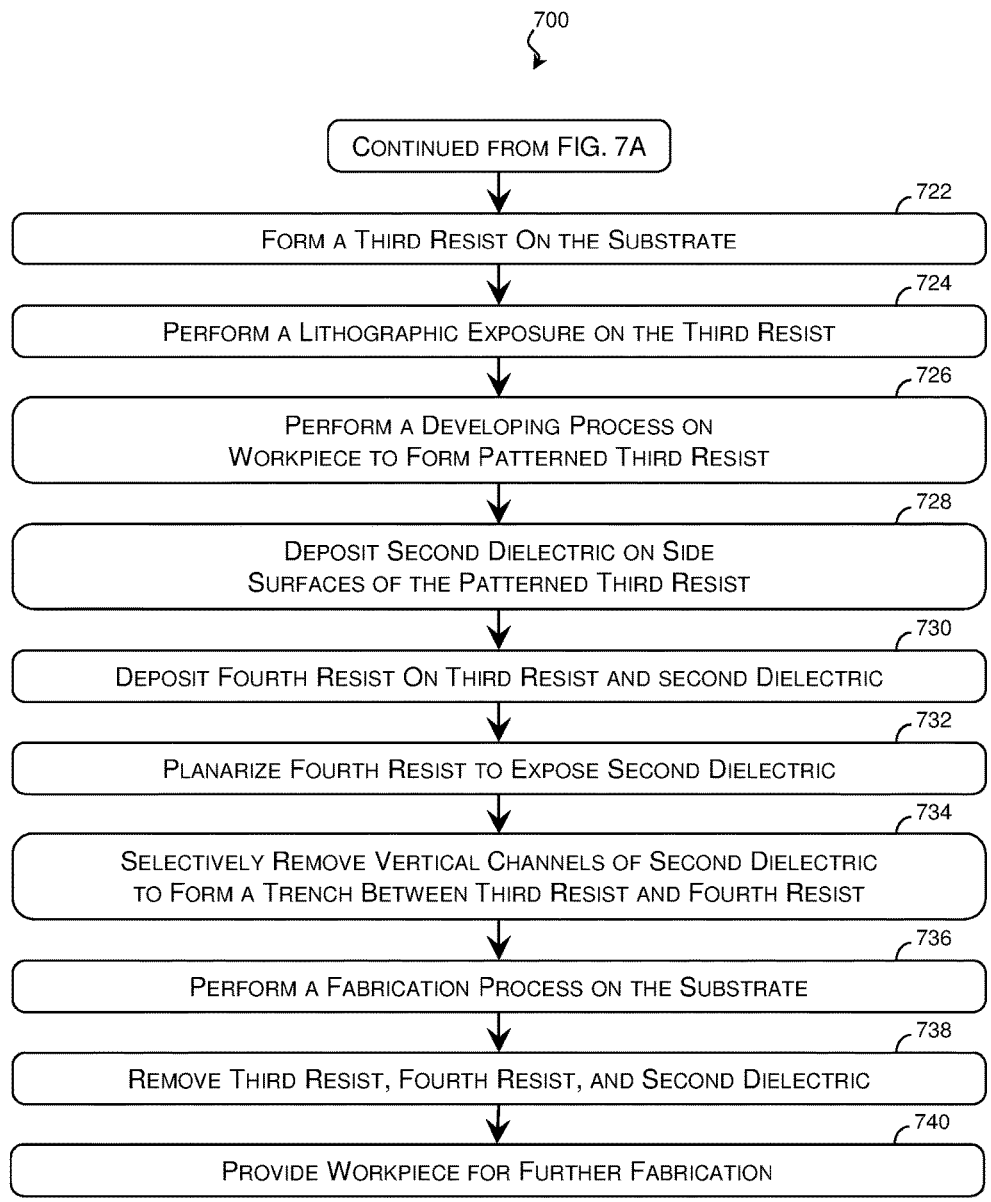

Further examples of the technique are described with reference to FIGS. 7A-22B. In that regard, FIGS. 7A and 7B are flow diagrams of a method 700 of fabricating a workpiece using orthogonal features according to various aspects of the present disclosure. Additional steps can be provided before, during, and after the method 700, and some of the steps described can be replaced or eliminated for other embodiments of the method 700. FIGS. 8A, 9A, 10A, 11A, 12A, 13A, 14A, 15A, 16A, 17A, 18A, 19A, 20A, 21A, and 22A are top-view diagrams of the workpiece 800 at various stages of the method 700 of fabricating the workpiece 800 according to various aspects of the present disclosure. FIGS. 8B, 9B, 10B, 11B, 12B, 13B, 14B, 15B, 16B, 17B, 18B, 19B, 20B, 21B, and 22B are cross-sectional diagrams of the workpiece 800 at various stages of the method 700 of fabricating the workpiece 800 according to various aspects of the present disclosure. In particular, FIGS. 8B, 9B, 10B, 11B, 12B, 13B, and 14B are cross-sections taken along line 802 of the corresponding top-view diagrams, while FIGS. 15B, 16B, 17B, 18B, 19B, 20B, 21B, and 22B are cross-sections taken along line 1502 of the corresponding top-view diagrams.

In contrast to some of the above examples, method 700 divides an area of the workpiece 800 into orthogonal sets of parallel stripes. Stripes running in a first direction are fabricated first, and perpendicular stripes are fabricated thereafter.

Referring first to block 702 of FIG. 7A and to FIGS. 8A and 8B, a workpiece 800 is received that includes a substrate 804 that is to undergo a fabrication process. The substrate 804 may be substantially similar to the substrate 204 of FIGS. 2A-6B. In various examples, the substrate 804 includes an elementary (single element) semiconductor, a compound semiconductor, a non-semiconductor material, and/or combinations thereof.

Referring to block 704 of FIG. 7A, a first resist 804 is applied to the substrate. This may be performed substantially as described in block 104 of FIG. 1. The first resist 804 may be substantially similar to the resist 206 of FIGS. 2A-6B. In various examples, the first resist 804 includes a photoresist material, an e-beam resist material, and/or other suitable resist material and is applied by spin coating or other suitable technique.

Referring to block 706 of FIG. 7A, a lithographic exposure is performed on the workpiece 800 that exposes selected regions of the first resist 804 to radiation. This may be performed substantially as described in block 106 of FIG. 1.

Referring to block 708 of FIG. 7A and to FIGS. 9A and 9B, a developing process is performed on the workpiece 800 to form a patterned first resist 804. This may be performed substantially as described in block 108 of FIG. 1. The developing process may begin with a post-exposure bake. Following the post-exposure bake, a developer is applied to the workpiece 800. The developer dissolves or otherwise removes either the exposed regions of the first resist 804 in the case of a positive resist development process or the unexposed regions of the first resist 804 in the case of a negative resist development process. After the developer is applied to the workpiece 800, the patterned first resist 804 may be rinsed, and a hard bake may be performed on the workpiece 800 to further stabilize the pattern of the first resist 804.

The pattern of the resist 804 after developing may have any suitable shape and structure. In some embodiments, the pattern is governed by the stability of the resist 804, limitations of a lithographic system used to pattern the resist 804, fabrication processes to be performed using the resist 804, and/or other factors. In some examples, the patterned resist includes sets of substantially parallel features of the first resist 804 extending in a first direction 902. The features of the first resist 804 may have any suitable aspect ratio, and in some such embodiments, the pattern is structured to limit the ratio of trench height (as indicated by marker 904) to trench width (as indicated by marker 906) to a particular threshold (e.g., a ratio of ≤5).

Referring to block 710 of FIG. 7A and to FIGS. 10A and 10B, a first dielectric material 1002 is deposited on the patterned first resist 804 and particularly on the side surfaces of the resist 804. This may be performed substantially as described in block 110 of FIG. 1. The first dielectric material 1002 may be substantially similar to the dielectric material 402 of FIGS. 4A-6B. The first dielectric material 1002 may include a semiconductor oxide, a semiconductor nitride, a semiconductor oxynitride, a semiconductor carbide, and/or other suitable insulator materials, and may be formed to any suitable thickness. The first dielectric material 1002 may be selected to have a different etchant sensitivity than the first resist 804. In some examples, the first dielectric material 1002 includes silicon oxide and is formed to a thickness 1004 of between about 20 nm and about 50 nm.

The first dielectric material 1002 may be deposited by any suitable technique or combination of techniques such as CECVD and/or PECVD. In some examples, the first dielectric material 1002 is deposited at a temperature between about 50° C. and about 100° C. or between about room temperature (~20° C.) and about 100° C. These ranges have been determined to be sufficiently warm to promote deposition of the dielectric material 1002 without risk of deforming the first resist 806. In contrast, deposition temperatures below these ranges may not allow proper deposition, and deposition temperatures above these ranges may cause the first resist 806 to deform.

Referring to block 712 of FIG. 7A and to FIGS. 11A and 11B, a second resist 1102 is deposited on the first resist 804 and the first dielectric material 1002. The second resist 1102 may be substantially similar to the first resist 804 and may include a photoresist material, an e-beam resist material, and/or other suitable resist material. Alternately, the second resist 1102 may be a lithographically inert dielectric (e.g., some spin-on dielectrics) or other suitable resist material. In some embodiments, the second resist 1102 is selected to have different etchant sensitivity than the first dielectric material 1002.

The second resist 1102 may be applied by any suitable technique, such as spin coating, and may be cured using heat, radiation, e-beam exposure, and/or plasma exposure. In embodiments where the second resist 1102 includes a photoresist material, the second resist 1102 may be exposed using a flood exposure to stabilize the photosensitive components.

Referring to block 714 of FIG. 7A and to FIGS. 12A and 12B, the second resist 1102 is planarized to expose the first dielectric material 1002. This may be performed by any suitable technique, and in some examples, the second resist 1102 is planarized by a CMP process. In addition to the second resist 1102, the CMP process may planarize the first resist 804 and the first dielectric material 1002. By exposing the first dielectric material 1002, the planarization creates features of the first resist 804 and features of the second resist 1102 separated by the first dielectric material 1002.

The planarization of block 714 exposes the vertical channels of the first dielectric material 1002, and referring to block 716 of FIG. 7A and to FIGS. 13A and 13B, the vertical channels of the first dielectric material 1002 are selectively removed by an etching process such as dry etching, wet etching, and/or other etching methods. The etchant chemistries, temperature, duration, and other parameters may be configured to spare the first resist 804 and the second resist 1102 from significant etching. The removal of the first dielectric material 1002 leaves trenches 1302 extending in the first direction 902 between the features of the first resist 804 and the features of the second resist 1102. The trenches 1302 formed by the removal of the first dielectric material 1002 may be significantly narrower than those formed using resist material(s) alone, and in some embodiments, the ratio of trench height to trench width exceeds 50.

Figures 14A, 14B:
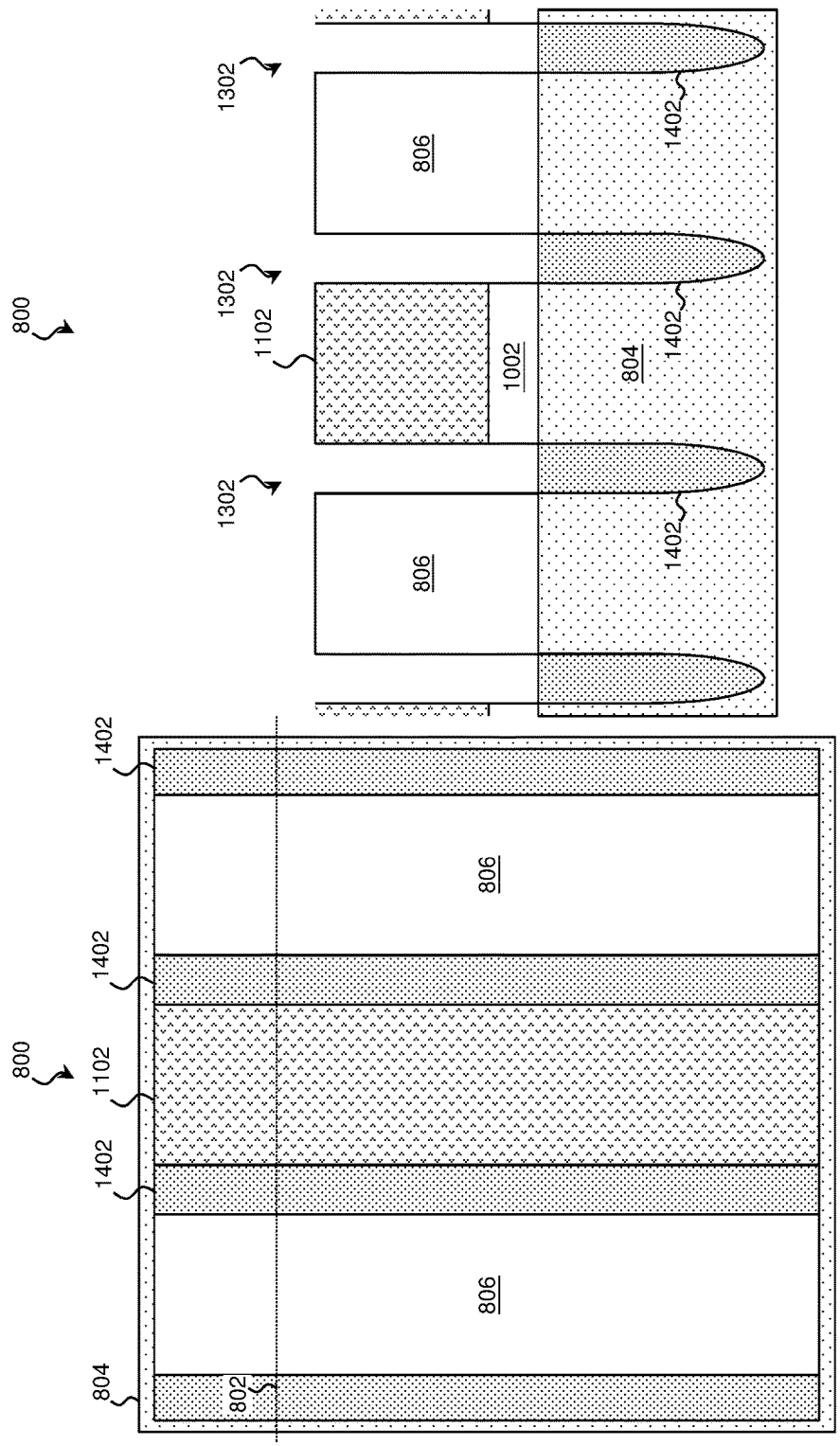

Referring to block 718 of FIG. 7A and to FIGS. 14A and 14B, a fabrication process is performed on the workpiece 800. This may be performed substantially as described in block 112 of FIG. 1. The fabrication process may be any suitable process and may utilize the patterned resists to processes exposed portions of the substrate 804 differently from those portions covered by the first resist 804 and second resist 1102. For example, the fabrication process may include an ion implantation process to form a junction isolation structure 1402 in the substrate 804, other ion implantation processes, etching processes, deposition processes, epitaxy processes, and/or other suitable processes.

Referring to block 720 of FIG. 7A, any remaining portion of the first resist 804, the second resist 1102, and/or the first dielectric material 1002 is removed. This may be performed substantially as described in block 114 of FIG. 1. These materials may be removed by any suitable etching and/or stripping technique such as dry etching, wet etching, and/or other etching methods.

As the process of blocks 704-720 may be performed on stripes of the substrate 804 running in the first direction 902, in some embodiments, the processes are then repeated in a second direction 1504 perpendicular to the first. Referring to block 722 of FIG. 7B and to FIGS. 15A and 15B, a third resist 1506 is applied to the substrate. This may be performed substantially as described in block 704 of FIG. 7A, and the third resist 1506 may be substantially similar to the first resist 804 and/or the second resist 1102. In various examples, the third resist 1506 includes a photoresist material, an e-beam resist material, and/or other suitable resist material and is applied using by spin coating or other suitable technique.

Referring to block 724 of FIG. 7B, a lithographic exposure is performed on the workpiece 800 that exposes selected regions of the third resist 1506 to radiation, and referring to block 726 of FIG. 7B and to FIGS. 16A and 16B, a developing process is performed on the workpiece 800. This may be performed substantially as described in blocks 706 and 708, respectively. The developing process may begin with a post-exposure bake. Following the post-exposure bake, a developer is applied to the workpiece 800. The developer dissolves or otherwise removes either the exposed regions of the third resist 1506 in the case of a positive resist development process or the unexposed regions of the third resist 1506 in the case of a negative resist development process. After the developer is applied to the workpiece 800, the patterned third resist 1506 may be rinsed, and a hard bake may be performed on the workpiece 800 to further stabilize the pattern of the resist 1506.

The pattern of the third resist 1506 after developing may have any suitable shape and structure. In some embodiments, the pattern is governed by the stability of the third resist 1506, by limitations of a lithographic system used to pattern the third resist 1506, by the fabrication process to be performed using the patterned third resist 1506, and/or by other factors. In some examples, the patterned resist includes sets of substantially parallel features of the third resist 1506 extending in a second direction 1504 substantially perpendicular to the previous features of the first resist 804.

Referring to block 728 of FIG. 7B and to FIGS. 17A and 17B, a second dielectric material 1702 is deposited on the developed third resist 1506 and particularly on the side surfaces of the resist 1506. This may be performed substantially as described in block 710 of FIG. 7A. The second dielectric material 1702 may be substantially similar to the first dielectric material 1002 and may include a semiconductor oxide, a semiconductor nitride, a semiconductor oxynitride, a semiconductor carbide, and/or other suitable insulator materials. The second dielectric material 1702 may be selected to have a different etchant sensitivity than the third resist 1506 and may be formed to any suitable thickness. In some examples, the second dielectric material 1702 includes silicon oxide and is formed to a thickness 1704 of between about 20 nm and about 50 nm.

The second dielectric material 1702 may be deposited by any suitable technique or combination of techniques such as CECVD and/or PECVD. In some examples, the second dielectric material 1702 is deposited at a temperature between about 50° C. and about 100° C. or between about room temperature (~20° C.) and about 100° C. These ranges have been determined to be sufficiently warm to promote deposition of the second dielectric material 1702 without risk of deforming the third resist 1506. In contrast, deposition temperatures below these ranges may not allow proper deposition, and deposition temperatures above these ranges may cause the third resist 1506 to deform.

Figures 18A, 18B:
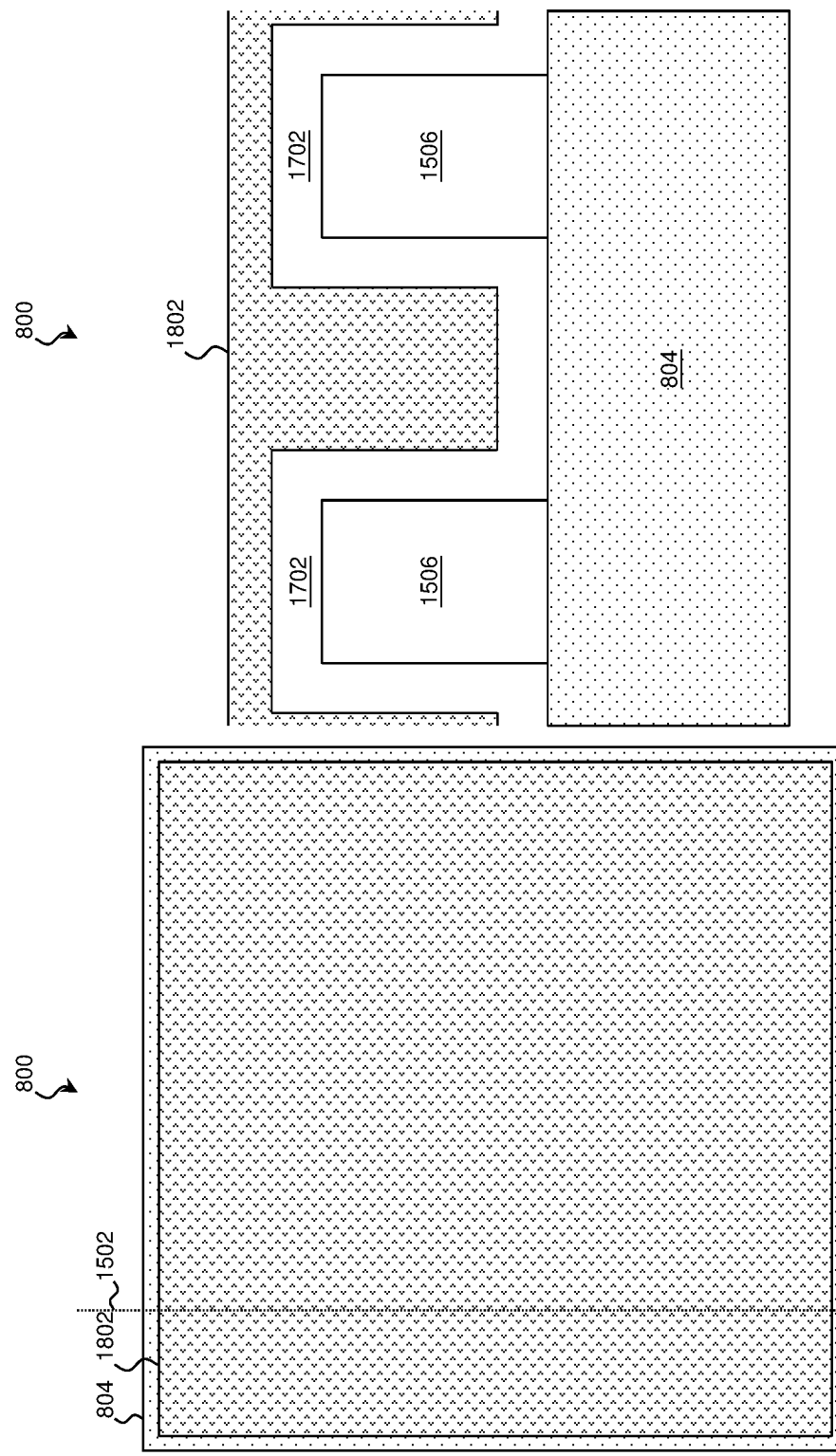

Referring to block 730 of FIG. 7B and to FIGS. 18A and 18B, a fourth resist 1802 is deposited on the third resist 1506 and the second dielectric material 1702. The fourth resist 1802 may be substantially similar to the third resist 1506 and may include a photoresist material, an e-beam resist material, and/or other suitable resist material. Alternately, the fourth resist 1802 may be a lithographically inert dielectric (e.g., some spin-on dielectrics) or other suitable resist material. In some embodiments, the fourth resist 1802 is selected to have different etchant sensitivity than the second dielectric material 1702.

The fourth resist 1802 may be applied by any suitable technique, such as spin coating, and may be cured using heat, radiation, e-beam exposure, and/or plasma exposure. In embodiments where the fourth resist 1802 includes a photoresist material, the fourth resist 1802 may be exposed using a flood exposure to stabilize the photosensitive components.

Referring to block 732 of FIG. 7B and to FIGS. 19A and 19B, the fourth resist 1802 is planarized to expose the second dielectric material 1702. This may be performed substantially as described in block 714 of FIG. 7A, and in some examples, the fourth resist 1802 is planarized by a CMP process. In addition to the fourth resist 1802, the CMP process may planarize the third resist 1506 and the second dielectric material 1702. By exposing the second dielectric material 1702, the planarization creates features of the third resist 1506 and features of the fourth resist 1802 separated by the second dielectric material 1702.

The planarization of block 732 exposes the vertical channels of the second dielectric material 1702, and referring to block 734 of FIG. 7B and to FIGS. 20A and 20B, the vertical channels of the second dielectric material 1702 are selectively removed by an etching process such as dry etching, wet etching, and/or other etching methods. The etchant chemistries, temperature, duration, and other parameters may be configured to spare the third resist 1506 and the fourth resist 1802 from significant etching. The removal of the first dielectric material 1002 leaves trenches 2002 extending in the second direction 1504 between the third resist 1506 and the fourth resist 1802. The trenches 2002 formed by the removal of the second dielectric material 1702 may be significantly narrower than those formed using resist material(s) alone, and in some embodiments, the ratio of trench height to trench width exceeds 50.

Figures 22A, 22B:
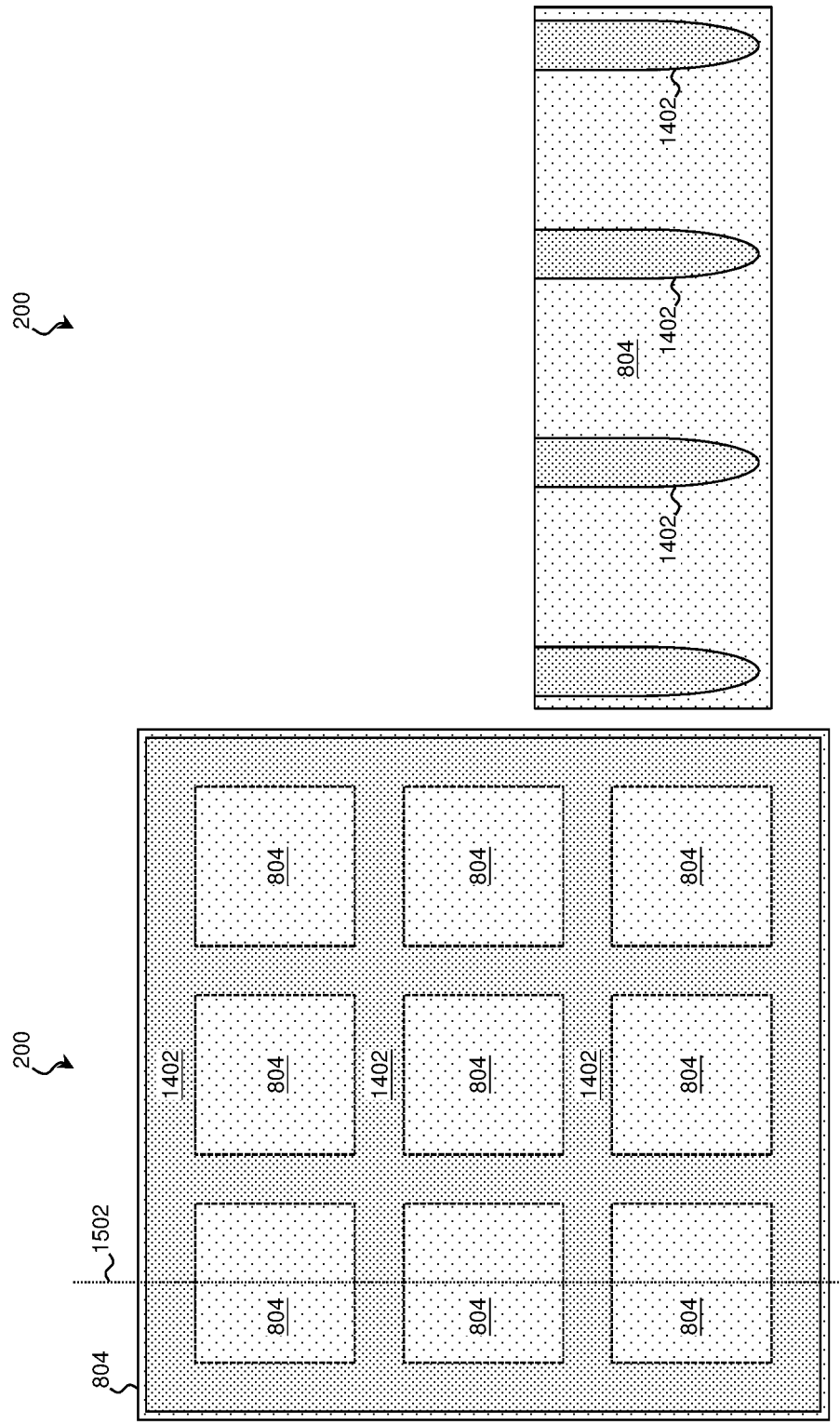

Referring to block 736 of FIG. 7B and to FIGS. 21A and 22B, a fabrication process is performed on the workpiece 800. This may be performed substantially as described in block 718 of FIG. 7A. The fabrication process may be any suitable process and may utilize the patterned resists to processes exposed portions of the substrate 804 differently from those portions covered by the third resist 1506 and fourth resist 1802. For example, the fabrication process may include an ion implantation process to further form a junction isolation structure 1402 in the substrate 804, other ion implantation processes, etching processes, deposition processes, epitaxy processes, and/or other suitable processes.

Referring to block 738 of FIG. 7B and to FIGS. 22A and 22B, any remaining portion of the third resist 1506, the fourth resist 1802, and/or the second dielectric material 1702 is removed. This may be performed substantially as described in block 720 of FIG. 7. These materials may be removed by any suitable etching and/or stripping technique such as dry etching, wet etching, and/or other etching methods.

Referring to block 740, the workpiece 800 is provided for further fabrication processes. For example, the workpiece 800 may be used to fabricate an image sensor, other integrated circuit chip, a system on a chip (SOC), and/or a portion thereof, and thus the subsequent fabrication processes may form various passive and active microelectronic devices such as sensors, resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Thus, the present disclosure provides examples of forming a pattern for integrated circuit fabrication. In some examples, a method includes receiving a substrate. A patterned resist is formed on the substrate and has a trench defined therein. A dielectric material is deposited on the patterned resist and within the trench such that the dielectric narrows a width of the trench to further define the trench. A fabrication process is performed on a region of the substrate underlying the trench defined by the dielectric. In some such examples, the fabrication process includes an ion-implantation process, and a thickness of the dielectric at a bottom of the trench permits the ion-implantation process to implant the region of the substrate through the dielectric. In some such examples, the ion-implantation process forms a junction isolation region within the substrate. In some such examples, the junction isolation region isolates a set of pixel regions of an image sensor. In some such examples, the depositing of the dielectric is performed at a temperature between about 20° C. and about 100° C. In some such examples, the depositing of the dielectric includes a technique from a group consisting of catalyst enhanced chemical vapor deposition and plasma enhanced chemical vapor deposition. In some such examples, the depositing of the dielectric is configured to deposit the dielectric substantially conformally within the trench. In some such examples, the trench having the narrowed width has a height-to-width ratio of greater than or equal to 13. In some such examples, the trench prior to the depositing of the dielectric has a height-to-width ratio of less than or equal to 10.

In further examples, a method includes receiving a substrate and depositing a resist material on the substrate. The resist material is patterned to form a first feature and a second feature with a trench disposed therebetween. A dielectric is deposited within the trench, and a fabrication process is performed on the substrate using the trench having the dielectric deposited therein. In some such examples, the fabrication process is performed on a first region of the substrate, and the resist and a first portion of the dielectric on a sidewall of the trench are configured to protect a second region of the substrate from the fabrication process. In some such examples, the fabrication process includes an ion-implantation process, and a second portion of the dielectric on a bottom of the trench above the first region of the substrate is configured to implant the first region of the substrate through the dielectric. In some such examples, the fabrication process includes an ion-implantation process, and the ion-implantation process forms a junction isolation region within the substrate. In some such examples, the junction isolation region isolates a set of pixel regions of an image sensor. In some such examples, the depositing of the dielectric is performed at a temperature between about 20° C. and about 100° C. In some such examples, the depositing of the dielectric includes a technique from a group consisting of catalyst enhanced chemical vapor deposition and plasma enhanced chemical vapor deposition. In some such examples, the trench after the depositing of the dielectric has a height-to-width ratio of greater than or equal to 13.

In yet further examples, a method includes receiving a substrate, and patterning a first resist on the substrate to form a first feature. A dielectric is deposited on a side surface of the first feature, and a second resist is deposited on the substrate to form a second feature separated from the first feature by the dielectric. The dielectric is selectively removed to form a trench between the first feature and the second feature, and the substrate exposed by the trench is selectively processed. In some such examples, the dielectric is a first dielectric, the trench is a first trench, and the first trench extends in a first direction. A third resist on the substrate is patterned to form a third feature. A second dielectric is deposited on a side surface of the third feature, and a fourth resist is deposited on the substrate to form a fourth feature separated from the third feature by the second dielectric. The second dielectric is selectively removed to form a second trench between the third feature and the fourth feature that extends in a second direction substantially perpendicular to the first direction. The substrate exposed by the second trench is selectively processed. In some such examples, the processing of the substrate exposed by the trench includes an ion implantation to form a junction isolation region within the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  receiving a substrate;
  forming a patterned resist on the substrate, wherein the patterned resist has a trench defined therein;
  depositing a dielectric on the patterned resist and within the trench such that the dielectric narrows a width of the trench to further define the trench, wherein the depositing of the dielectric is performed at a temperature between about 20° C. and about 100° C.; and
  performing a fabrication process on a region of the substrate underlying the trench defined by the dielectric.

2. The method of claim 1, wherein:
the fabrication process includes an ion-implantation process; and
a thickness of the dielectric at a bottom of the trench permits the ion-implantation process to implant the region of the substrate through the dielectric.

3. The method of claim 2, wherein the ion-implantation process forms a junction isolation region within the substrate.

4. The method of claim 3, wherein the junction isolation region isolates a set of pixel regions of an image sensor.

5. The method of claim 1, wherein the depositing of the dielectric includes a technique from a group consisting of catalyst enhanced chemical vapor deposition and plasma enhanced chemical vapor deposition.

6. The method of claim 1, wherein the depositing of the dielectric is configured to deposit the dielectric substantially conformally within the trench.

7. The method of claim 1, wherein the trench having the narrowed width has a height-to-width ratio of greater than or equal to 13.

8. The method of claim 7, wherein the trench prior to the depositing of the dielectric has a height-to-width ratio of less than or equal to 10.

9. The method of claim 1, wherein the patterned resist includes a photoresist material and the dielectric physically contacts the photoresist material.

10. The method of claim 9, wherein the depositing of the dielectric is configured such that the deposited dielectric physically contacts a top surface and opposing side surfaces of the photoresist material.

11. The method of claim 10, wherein the depositing of the dielectric is configured such that the deposited dielectric further physically contacts the substrate, the method further comprising removing a portion of the dielectric from the substrate prior to the performing of the fabrication process.

12. A method comprising:
receiving a substrate;
depositing a resist material on the substrate;
patterning the resist material to form a first feature and a second feature with a trench disposed therebetween;
depositing a dielectric within the trench, wherein the trench after the depositing of the dielectric has a height-to-width ratio of greater than or equal to 13; and
performing a fabrication process on the substrate using the trench having the dielectric deposited therein.

13. The method of claim 12, wherein:
the fabrication process is performed on a first region of the substrate; and
the resist material and a first portion of the dielectric on a sidewall of the trench are configured to protect a second region of the substrate from the fabrication process.

14. The method of claim 13, wherein:
the fabrication process includes an ion-implantation process; and
a second portion of the dielectric on a bottom of the trench above the first region of the substrate is configured to implant the first region of the substrate through the dielectric.

15. The method of claim 13, wherein:
the fabrication process includes an ion-implantation process; and
the ion-implantation process forms a junction isolation region within the substrate.

16. The method of claim 15, wherein the junction isolation region isolates a set of pixel regions of an image sensor.

17. The method of claim 12, wherein the depositing of the dielectric is performed at a temperature between about 20° C. and about 100° C.

18. The method of claim 12, wherein the depositing of the dielectric includes a technique from a group consisting of catalyst enhanced chemical vapor deposition and plasma enhanced chemical vapor deposition.

19. A method comprising:
receiving a substrate;
patterning a first resist on the substrate to form a first feature;
depositing a dielectric on a side surface of the first feature;
depositing a second resist on the substrate to form a second feature separated from the first feature by the dielectric;
selectively removing the dielectric to form a trench between the first feature and the second feature; and
selectively processing a portion of the substrate exposed by the trench, wherein the selectively processing includes:
performing an ion-implantation process on the portion of the substrate exposed by the trench to form a junction isolation region the portion that isolates a set of pixel regions of an image sensor.

20. The method of claim 19, wherein the dielectric is a first dielectric, the trench is a first trench, and the first trench extends in a first direction, the method further comprising:
patterning a third resist on the substrate to form a third feature;
depositing a second dielectric on a side surface of the third feature;
depositing a fourth resist on the substrate to form a fourth feature separated from the third feature by the second dielectric;
selectively removing the second dielectric to form a second trench between the third feature and the fourth feature, wherein the second trench extends in a second direction substantially perpendicular to the first direction; and
selectively processing the substrate exposed by the second trench.

* * * * *